(12) United States Patent
Sandnes et al.

(10) Patent No.: US 11,795,787 B2
(45) Date of Patent: Oct. 24, 2023

(54) MODELLING OF OIL AND GAS NETWORKS

(71) Applicant: SOLUTION SEEKER AS, Oslo (NO)

(72) Inventors: Anders Sandnes, Oslo (NO); Bjarne Grimstad, Oslo (NO); Vidar Gunnerud, Oslo (NO)

(73) Assignee: SOLUTION SEEKER AS, Oslo (NO)

( * ) Notice: Subject to any disclaimer, the term of this patent is extended or adjusted under 35 U.S.C. 154(b) by 491 days.

(21) Appl. No.: 16/770,794

(22) PCT Filed: Dec. 10, 2018

(86) PCT No.: PCT/EP2018/084242
§ 371 (c)(1),
(2) Date: Jun. 8, 2020

(87) PCT Pub. No.: WO2019/110851
PCT Pub. Date: Jun. 13, 2019

(65) Prior Publication Data
US 2021/0181374 A1     Jun. 17, 2021

(30) Foreign Application Priority Data

Dec. 8, 2017   (GB) ...................................... 1720522
Dec. 8, 2017   (GB) ...................................... 1720527

(51) Int. Cl.
*E21B 43/00*     (2006.01)
*G06F 30/18*     (2020.01)
(Continued)

(52) U.S. Cl.
CPC .............. *E21B 43/00* (2013.01); *G06F 30/18* (2020.01); *G06F 30/27* (2020.01); *G06F 30/28* (2020.01); *E21B 43/14* (2013.01); *E21B 2200/20* (2020.05)

(58) Field of Classification Search
CPC ...... E21B 43/00; E21B 2200/20; E21B 43/14; G06F 30/18; G06F 30/28; G06F 30/27
(Continued)

(56) References Cited

U.S. PATENT DOCUMENTS

2002/0138241 A1   9/2002   Storm et al.
2014/0172382 A1   6/2014   Andrews et al.

FOREIGN PATENT DOCUMENTS

EP   2783069 B1   9/2015
GB   2462562 A    2/2010
(Continued)

OTHER PUBLICATIONS

Li, D., et al. "A new ICD/ICV well completion design optimizer and well management logic for full field reservoir simulation with multiple ICD/ICV wells." Abu Dhabi International Petroleum Exhibition & Conference. OnePetro, 2017. p. 1-17. (Year: 2017).*
(Continued)

*Primary Examiner* — John E Johansen
(74) *Attorney, Agent, or Firm* — Banner & Witcoff, Ltd.

(57) ABSTRACT

An oil and gas network comprises multiple branched flow paths, such as in multi-zonal wells and/or multibranched wells and/or networks including multiple wells, and multiple control points at different branches, wherein the multiple control points may include multiple valves and/or pumps for controlling the flow rate through respective flow paths of the multiple branched flow network. The network is modelled to model the variation of one or more flow parameter(s) in one or more flow path(s) of the network. A method for this modelling includes: generating a long-term model using a first set of data relating to measurements of the flow parameter(s) and the status of the control points over a first period of time, wherein the long-term model describes the relation-
(Continued)

ship between flow rates, the status of control points, and measured flow parameters including pressure and/or temperature; generating a short-term model using a second set of data relating to measurements of the flow parameter(s) and the status of the control points over at least one second period of time, wherein the at least one second period of time is shorter than the first period of time, and wherein the short-term model describes the relationship between the status of control points flow parameters including pressure and/or temperature; and combining the short-term model with the long-term model by: using the short-term model to determine pressure and/or temperature values that will result from the status of one or more control points or from proposed changes to those control points; using the determined pressure and/or temperature values from the short-term model along with the status of, or the proposed changes to, the control points as inputs to the long-term model and then using the long-term model to determine flow rate values that will result from those inputs; and thereby obtaining a combined model allowing for estimation of flow rates in real time as well as prediction of the effects of changes in the status of one or more of the control points. A method for training a model of this oil and gas network includes: modelling one or more flow parameter(s) in one or more flow path(s) of the network, the modelling including: generating a model using data relating to measurements of the flow parameter(s) and the status of the control points over a period of time; wherein the model describes the relationship between flow rates, the status of control points, and measured flow parameters including pressure and/or temperature; and wherein generating the model includes training the model under constraints requiring: (i) that the sum of the modelled flow rates from each branch of the flow network that contribute to a combined flow after branched flow paths join at one or more nodes must be equivalent to the respective measured combined flow rate, where a measurement of the combined flow is available, and (ii) that training of the model is suspended or modified for certain flow paths when the status of the control points is such that those flow paths will have zero flow, and/or that a flow rate for an individual flow path or branch must be or is encouraged to zero when an associated valve is closed and/or if a pump required for non-zero flow rate is inactive.

10 Claims, 4 Drawing Sheets

(51) Int. Cl.
  *G06F 30/27* (2020.01)
  *G06F 30/28* (2020.01)
  *E21B 43/14* (2006.01)

(58) Field of Classification Search
  USPC .................................................. 703/6, 10
  See application file for complete search history.

(56) References Cited

FOREIGN PATENT DOCUMENTS

| | | |
|---|---|---|
| GB | 2471605 A | 1/2011 |
| WO | 2013072490 A2 | 5/2013 |
| WO | 2014170425 A2 | 10/2014 |
| WO | 2016205158 A1 | 12/2016 |
| WO | 2017077095 A1 | 5/2017 |
| WO | 2017165949 A1 | 10/2017 |

OTHER PUBLICATIONS

Al-Khelaiwi, Faisal T., et al. "Advanced wells: a comprehensive approach to the selection between passive and active inflow-control completions." SPE Production & Operations 25.03 (2010). pp. 305-326. (Year: 2010).*
Molenaar, Menno M., et al. "First downhole application of distributed acoustic sensing for hydraulic-fracturing monitoring and diagnostics." SPE Drilling & Completion 27.01 (2012). pp. 32-38. (Year: 2012).*
Mar. 7, 2019—(WO) International Search Report and Written Opinion—App PCT/EP2018/084242.
May 22, 2018—(GB) Search Report—App 1720522.0.
May 22, 2018—(GB) Search Report—App 1720527.9.

* cited by examiner

MODELLING OF OIL AND GAS NETWORKS

The present application is a U.S. National Phase of International Application No. PCT/EP2018/084242, filed on Dec. 10, 2018, designating the United States of America, and claims priority to British Patent Application No. 1720522.0, filed on Dec. 8, 2017 and British Patent Application No. 1720527.9, filed on Dec. 8, 2017. This application claims priority to and the benefit of the above-identified applications, which are fully incorporated by reference herein in their entirety.

The present invention relates to methods of modelling oil and gas flow networks as well as to corresponding systems and computer programme products. The modelling may be used in order to improve the performance of the flow network or to obtain better and/or more data to determine how the flow network is operating. The invention may be used with oil and gas production networks where multiple wells supply single or multiphase fluids to a network that combines the flows via manifolds, separators, and the like.

There are many industries where flow networks are used, for example in the processing and manufacturing of fluid and liquid products in factories and refineries. The oil and gas industry is an example of particular interest since the flow network includes oil and gas wells resulting in inputs to the flow network that can be difficult to measure and/or model accurately and in many cases may vary unpredictably. Further, the availability of critical process components changes with time and thereby capacities vary equivalently. It is thus difficult to optimise production settings for such networks. Simulations and models can be used in an attempt to predict the response of flow networks to changes in process parameters such as flows, pressures, mixing of different constituents and so on. However these models and accompanying optimisation problems can become very cumbersome and require significant computing power, whilst still providing nothing more than a computer assisted guess for optimum settings for the flow network.

WO2014/170425 discloses a method for control of an oil and gas flow network for improving performance, the method involving applying excitations at control points of the flow network as online 'experiments' (including excitations applied during normal operation of the network) to allow for identification of variations induced by the excitations and hence allow for iterative adjustment of the control of the flow network to improve performance. This approach provided a significant advance in the art, in particular in relation to optimisation of performance. However, it has various restrictions including the need for excitations and it also does not have a particularly broad application in terms of the output of the process. In WO2014/170425 the reaction of the oil and gas network to a stimulus is predicted in an approximate fashion using simple local models built around a specific combination of control settings and production values. This works well in situations where one is able to iterate toward a desired outcome using real-world data with updates being provided each time there is a change made to the control settings. However, there is a need for a system that can model the performance of an oil and gas flow network in real time and that can accurately predict the response of such a system without the need to iteratively update the models whenever a change is made, although with the ability to do efficiently so if required.

WO2017/077095 describes a way to gather together data from an oil and gas network and to place it into a compact database for better analysis of the data that can take account of the historical operation of the flow network. According to this method the large volumes of data that are recorded for an oil and gas flow network can be reduced based on the identification of steady state intervals in the data and the use of statistics. The statistics can provide information concerning the operation of the flow network, allowing the flow network to be assessed either directly or via further analysis, for example by using local models. This type of assessment of the flow network may be for checking if it is performing optimally and/or for providing qualitative and/or quantitative information on the performance of the flow network, for example production levels for oil and/or gas. The assessment of the flow network may alternatively or additionally be for determining adjustments to the control points that would improve performance of the flow network.

Advantageously, the method of WO2017/077095 allows for assessment of a flow network based on data that is already being recorded for other purposes, for example for on-going monitoring by the operator, and/or based on data that has been stored during past use of the flow network. That is to say, the method may be applied using historical data, i.e. data that was gathered prior to implementation of the method, and identification of steady state intervals that have occurred during normal operation of the flow network. It can also make use of data gathered on an on-going basis during continued operation of the flow network. Unlike some earlier proposed methods, for example as in WO2014/170425, there is no need for specific excitations to be applied: instead data gathered during normal use of the flow network can be used. This technique gives a further advance over prior art such as WO2014/170425, but a need remains for a method for modelling of an oil and gas flow network that is capable of accurately capturing the behaviour of the wells, i.e. to provide for flow network monitoring (through e.g. Virtual Flow Metering (VFM)), as well as being able to predict future behaviour such as based on proposed modifications to control settings, i.e. to allow for optimisation similar to that described in WO2014/170425, but without the need for new real-world data to be input in an iterative process.

Viewed from a first aspect, the invention provides a method of modelling an oil and gas network, the network comprising multiple branched flow paths, such as in multi-zonal wells and/or multi-branch wells and/or networks including multiple wells, and multiple control points at different branches, wherein modelling the network includes modelling one or more flow parameter(s) in one or more flow path(s) of the network; the method comprising:

generating a long-term model using a first set of data relating to measurements of the flow parameter(s) and the status of the control points over a first period of time, wherein the long-term model describes the relationship between flow rates, the status of control points, and measured flow parameters including pressure and/or temperature;

generating a short-term model using a second set of data relating to measurements of the flow parameter(s) and the status of the control points over at least one second period of time, wherein the at least one second period of time is shorter than the first period of time, and wherein the short-term model describes the relationship between the status of control points and flow parameters including pressure and/or temperature; and combining the short-term model with the long-term model by: using the short-term model to determine pressure and/or temperature values that will result from the status of one or more control points or from proposed changes to those control points; using the determined pressure and/or temperature values from the short-term model along with the status of, or the proposed changes to, the control points as inputs to the long-term model and then using the long-term model to determine flow rate values that will result from those inputs or input changes; and thereby obtaining a combined model allowing for estimation of flow rates as well as prediction of the effects of changes in the status of one or more of the control points.

With this method it is possible to more accurately model the oil and gas flow network and to better capture the technical features of the oil and gas flow network within the model. The long-term model can take account of changes in the network over longer periods of time, in particular the so-called "reservoir effect", where pressure and/or temperature variations occur at a relatively slow rate due to depletion of the reservoirs that supply the oil and gas flow network. However, the inventors have found that such a long-term model cannot accurately predict the reaction of the network to a change in the status of a control point, because there is not sufficient data to separate the effect of historic changes in control points on the flow parameters from the reservoir effect. The short-term model operates over at least one second, shorter time period. This allows for an assumption that the reservoir effect has less impact on the data comprised within the at least one second time period, and in fact may largely be disregarded when considering the at least one second time period in isolation. This then permits the short term model to be used to predict the impact of changes in control points on the flow parameters, for example on temperatures and/or pressures, with this being assumed to represent the effect of the control points with little to negligible effect from well depletion. It is not wholly accurate for the short-term model to predict the effect on the whole system from such changes, but the output from the short-term model can act as an input within the long-term model so that the short term impact of control point adjustments can be overlaid with the longer-term data that better accounts for the reservoir effect in order that accurate predictions can be made.

Though the reservoir effect is largely disregarded whilst generating the short term model, it is possible to at least partially account for the reservoir effect, and any other longer term effects that might be associated with the flow network, within the short term model. As alluded to above, each second time period in itself is too short to allow for the data therein to be fully representative of the reservoir and other longer term effects that affect the oil and gas network. However, the short term model may be generated based on a plurality of second time periods, each second time period having a different start point in time and/or end point in time from every other second time period in said plurality. In generating the short term model based on a plurality of second time periods, a comparison between two or more of the second time periods (for example a pair of chronologically consecutive second time periods, or a plurality of pairs of chronologically consecutive time periods) may allow for the reservoir effect to be at least partly accounted for within the short term model. However, given the discrete nature of this comparison, the short term model will typically not be fully capable of accounting for the reservoir effect and its impact on the data comprised in the plurality of second time periods. Hence the short term model and the long term model should still be combined in order to fully account for the reservoir effect and thus accurately model the oil and gas network.

The oil and gas network may typically comprise multiple wells supplying hydrocarbon fluids via one or more manifolds and one or more separators into one or more output flow paths with output flow rates. The flow path(s) may include one or more flow path(s) of the network in which flows from more than one branch of the network have been combined. The total output flow rates may be measured flow rates and hence need not be estimated using the long-term model, but future values may be predicted using the combined model. The long-term model may be used to estimate the flow rates within different parts of the flow network and to estimate the contribution of different flow paths to the total (e.g. the contribution from different wells or from different zones of a multi-zonal and/or multi-branch well) There may be multiple manifolds and multiple separators. The long-term model and the short-term model may be arranged to be able to increase in size in a modular fashion to cater for networks of larger size with increased numbers of branches and increased numbers of control points. The long-term model and/or the short term model may use both of pressure and temperature as the measured flow parameters.

The long-term model and/or the short-term model may be generated in any suitable fashion based on the respective first or second set of data. In some example embodiments the models are trained using the data. The models may make use of one or more neural nets that are trained using the respective set of data. In one form the modelling method uses neural nets for both of the long-term model and the short-term model. In another form the modelling method uses a neural net for the long-term model and a physics-based model for the short term model, or alternatively the opposite may be used, i.e. a physics-based model for the long-term model and neural net for the short term model. Other machine learning or regression models may be used for both the short-term and the long term model. Potentially advantageous forms of neural net are discussed in further detail below.

The first time period for the long-term model should extend from a time in the past up until a more recent time based on which it is desired to make estimations and/or predictions concerning the oil and gas network. Typically the more recent time will be the time of the most recent data available, thereby allowing for estimation to be done in real time and to be as up to date as possible. This may involve data obtained in real time, although it will be understood that in some cases there may be a time lag between when the data is obtained and when it is available for use in the model.

The at least one second time period of the data for the short term model may also extend from a time in the past up until a more recent time (e.g. the time of the most recent data available) on which it is desired to make estimations and/or predictions concerning the oil and gas network. However, it is not required for the at least one second time period to extend up until the same most recent time as the first time period. The at least one second time period may instead extend up to different, earlier time. It will be appreciated, for the purposes of estimations and/or predictions using the combined model, the at least one second time period should not extend up to a time later than the time to which the first time period extends to.

In embodiments where the short term model is generated based on a plurality of second time periods, as alluded to above, each second time period will extend from a time in the past (start point) up until a more recent time (end point), with the time in the past (start point) and/or more recent time (end point) being different for each second time period. Each of the second time periods may be chronologically distinct and separate from every other second time period comprised in the plurality. Alternatively, there may be some chronological overlap between at least some of the second time periods and some other of the second time periods within the plurality. At least one of the plurality of second time periods upon which the short term model is based may extend to the same most recent time as the first time period upon which the first term model is based; however this is not a requirement.

The model may also be used with analysis of historical data. There are advantages if the first time period fully overlaps the, or each (in the case of a plurality of a second time periods), second time period and thus includes all of the data from the, or each, second time period. The first time period will typically comprise more data as compared to the second time period(s) given that the first time period typically spans a greater overall period of time. This may be more data going back further in time than the, or the plurality of second time period(s), and/or added data comprised in the periods of time between each of the plurality of second time periods. However, it may be the case that the combination of the plurality of second time periods in fact spans the same entire time as the first time period. In such a scenario, it may in fact be possible to build both the short term model and the long term model from the same collected data. In ensuring that first time period includes all of the data from the, or the plurality of second time period(s), an increase in the accuracy of the prediction step can be ensured. In example embodiments the first, longer, time period extends backward in time from a reference time and the or at least one second, shorter, time period extends backward in time from the same reference time.

It will be appreciated that advantages arise in any situation where the or each second time period for the short-term model is less than the first time period for the long-term model since this means that the long-term model is affected to a greater degree by the reservoir effect, whilst the data comprised in the or each of the second time periods for the short-term model is affected to a lesser degree. The method of the first aspect relies on this to allow for the short-term model to give a better prediction of the reaction to changes in control points, with the reservoir effect being largely disregarded when considering the data comprised in each second time period in isolation. The advantages of this technique may be increased by increasing the length of the first time period relative to the length of the, or each, second time period. Thus, the length of the first time period may be at least twice the length of the, or each, second time period, or at least three times the length of the, or each, second time period. In an example embodiment the length of the first time period may be at least five times the length of the, or each, second time period, optionally at least ten times the length of the, or each, second time period.

In scenarios where the short term model is generated on the basis of a plurality of second time periods, each second time period may be of equal length. However, this is not a requirement, and each second time period may be of the same and/or different lengths to other second time periods within the plurality.

The absolute length of the first time period and the, or each, second time period may also have an effect. The first time period should have a length such that the reservoir effect has an impact on the flow parameter(s), whereas the, or each, second time period should have a length such that the reservoir effect is reduced and ideally such that it can be disregarded when considering the data in the or each second time period in isolation. The first time period should preferably encompass numerous changes to the status of control points, whereas the, or each, second time period may encompass fewer changes. For example, the first time period may cover a time during which 100 or more changes are made to control points, optionally 1000 or more, whereas the, or each, second time period may cover a time during which the number of changes to control points is less than a half of the number for the first time period, optionally less than a fifth of the number of changes. The, or each, second time period should cover a time during which at least one change has occurred to at least one of the control points that for which it is desired to predict the effect of changing, and this can be seen as a minimum time span for the, or each, second time period. In embodiments where the short term model is based on a single second time period, it is preferred that the second time period covers a time during which at least one change has occurred to each of the control points that for which it is desired to predicts of changing. Therefore, if the, or at least one of the, second time period(s) is very short, there might be a scenario where one can predict the effect of changing only some of the control points.

It will be appreciated that not all of the control points of interest within the oil and gas network may change during a single, second time period. Thus, a single, second time period in itself may not comprise sufficient data indicative of changes to all (or all possible combinations of changes) of the control points of interest. Consequently a single, second time period may not comprise data indicative of the effect that said changes (or said combination of changes) have on the flow parameters of the oil and gas flow network. Absent this data, the short term model based solely on the data comprised in a single, second time period may not allow for the accurate modelling and prediction of all changes to flow parameters caused by changes to each and every control point of interest, and/or caused by all possible combinations of changes in the control points of interest. Thus, the combined model, inclusive of said short term model, may not be wholly accurate in modelling every aspect of the oil and gas network.

Therefore, as mentioned above, the short term model may be generated using data from a plurality of second time periods, wherein a change to each of the control points of interest has occurred at least once over the combined course of the plurality of second time periods. In basing the short term model on a plurality of second time periods it can be ensured that data indicative of changes to all of the control points of interest and data indicative of the effects to the flow parameters from changing all of the control points of interest are included in the short term model, thereby improving its and the combined model's accuracy in modelling the oil and gas flow network and predictions for the oil and gas network.

It is further preferable for all the possible combinations of changes to the control points of interest to happen over the course of the plurality of second time periods. In scenarios where the short term model is generated based on a plurality of second time periods in which all the possible combinations of changes to the control points of interest have occurred, the effects that said combination of changes has on the flow parameters of the oil and gas network can be better accounted for, predicted and modelled. Thus, both the accuracy of the short term and combined model can be improved.

In scenarios where the short term model is generated based on a plurality of second time periods, it will be appreciated that the reliability of the short term model and, consequently, the reliability of the combined long and short term model, may be improved and the accuracy of said models may also be improved. This is in view of the fact that the short term model can be based and/or trained on a larger volume and wider variety of data that is indicative not only of more changes of the control points in the oil and gas network, but is also indicative of more changes of the control points in the oil and gas network over a larger number of conditions and statuses of the oil and gas network. Thus, the short term model and, hence, the combined model may more accurately and reliably model the oil and gas network over a wider variety of statuses and/or conditions of the oil and gas network. In particular, the short term model and, hence, the combined model can more accurately model and predict the effects of an intended or desired change to the control points of the oil and gas network whilst the oil and gas network is under a particular status or condition if the short term model is based on a plurality of second time periods wherein at least one of the second time periods comprises data corresponding to the desired or intended change to the control points whilst the oil and gas network was in the same particular status or condition.

In a typical oil and gas network it may be appropriate for the first time period to be at least six months, optionally at least a year, and in some cases two years or more. The first time period may be between 6 months and 3 years, for example. If accurate data is available then it may be advantageous to extend the first time period as far back in time as the data permits, although it will be appreciated that there is a compromise to be made between accuracy of the model and the volume of data that needs to be processed.

For the, or each, second time period, again in a typical oil and gas network, this should be set as less than the first time period as discussed above, and it may be appropriate for the, or each, shorter, second time period to be six months or less, optionally three months or less, optionally one month or less, or even in some cases less than two weeks, including one week or less. The, or each, second time period should be long enough for changes to have occurred within the network allowing for the short-term model to include the effect of changes in the status of at least one control point. At least one change to each of the control point(s) in question should have occurred over the course of the, or each, second time period. The, or each, second time period may hence be at least one week, or at least one month.

In some examples the, or each, second time period is three months or less and the first time period is two years or more. This has been found to allow for accurate modelling that takes account of the reservoir effect in the first time period and allows for control point changes to have occurred during the second time period, whilst also being based on a sensible volume of data.

The long-term model may be configured to ensure valid mass balances in the network. This allows for increased accuracy especially in situations where the reservoir effect can change the mass flow rate independently of changes in the control points.

The generation of the long-term model may advantageously include training the model using the first set of data with the first set of data including total flow rates through the network, and the training requiring that the sum of the modelled flow rates from each branch of the flow network must be equivalent to the measured total flow rate for respective combined branches. Thus, the model may be trained with the constraint that that the sum of the modelled flow rates from each branch of the flow network that contribute to a combined flow after branched flow paths join at one or more nodes must be equivalent to the respective measured combined flow rate, where a measurement of the combined flow is available. This hence ensures mass balances and improves model accuracy when training the model, as noted above.

Moreover, since the network is an oil and gas flow network then this training may be refined by suspending or modifying the training process of the sub-models for the flow paths that are closed off, such as if a flow path is shut in or if relevant pumps or valves are set so that the flow is zero. Thus, for example, in circumstances where it is known that the flow is zero for one or more flow paths then the method may include stopping training of the model for the one or more flow paths that have zero flow (whilst continuing to train sub-models for the other flow paths that still have non-zero flow). Alternatively, in circumstances where it is known that flow is zero for one or more flow paths then the method may modify the training of the model for the one or more flow paths that have zero flow (whilst continuing to train sub-models for the other flow paths as before that still have non-zero flow). Said modification may allow for the model for said one or more flow paths to tend toward a zero flow without the need to stop the training of the one or more flow paths in order to replicate said zero flow. That is to say, based on the inputs to the model for the one or more flow paths that have zero flow, the model can itself determine that said one or more flow paths should be represented by a zero flow and thus the model itself tends to zero flow without the requirement that it must be zero. In these examples, a sub-model may be any part of the model that is smaller than the model, for example it may be a sub-model relating to a particular flow path or to a set of flow paths. Training of the sub-model may begin again, or may continue as before in scenarios where the training has been modified, if the status of the control points changes such that the flow is no longer zero for the flow paths where training was suspended/modified. In the example of a non-producing well then the model is trained for branches of the network that are producing, but training stops or is modified for non-producing branches. The reason is that the correlations between flow parameters and a flow rate that we know must be zero do not follow the same patterns as when the respective flow paths or branches of the network are producing. The training process may include a requirement that a flow rate for an individual flow path must be zero when a valve is closed or in some circumstances when a pump is inactive, i.e. when the pump must be active in order to have a non-zero flow rate. Alternatively, the training process may encourage the flow rate for an individual flow path to zero when a valve is closed or, in some circumstances, when a pump is inactive. Note, in some cases a valve opening indicator or valve opening measurement might not be zero even though the well is closed, therefore one might provide a threshold of e.g. 3% opening, and assume that the well is closed if the valve opening indicator is below a threshold value. The valve may be a choke valve, wing valve, master valve, or downhole safety valve for example. Input parameters such as pressure and/or temperature for this flow path will typically be above zero. The model training system knows that when the output flow rate is zero then the correlation between the flow parameter(s) and the flow rate will not behave in the same way (following the same patterns) as when the flow rate is non-zero, therefore it stops training the model or modifies training of the model for the branch that is closed (or nominally closed). This enhances the accuracy of the model. In scenarios where training is suspended, it can be ensured that relevant chokes/valves correctly have zero flow in all circumstances during training of the model, and so that inactive pumps similarly have zero flow. In this way the model is specifically adapted to represent the technical considerations for an oil and gas flow network. In scenarios where the training is modified, the training can encourage all relevant chokes/valves and inactive pumps toward a zero flow during training of the model. In this way, the model can be encouraged to represent the technical considerations for an oil and gas flow network.

The above discussed training is particularly beneficial for a model based on one or more neural nets, or other machine learning and regression models.

The use of a model trained using features as above is considered to be novel and inventive in its own right, and therefore, viewed from a second aspect, the invention provides a method for training a model of an oil and gas network, the network comprising multiple branched flow paths, such as in multi-zonal wells and/or multi-branch wells and/or networks including multiple wells, and multiple control points at different branches, wherein the multiple control points include multiple valves and/or pumps for controlling the flow rate through respective flow paths of the multiple branched flow network; and the method comprising: modelling one or more flow parameter(s) in one or more flow path(s) of the network, the modelling include: generating a model using data relating to measurements of the flow parameter(s) and the status of the control points over a period of time; wherein the model describes the relationship between flow rates, the status of control points, and measured flow parameters including pressure and/or temperature; and wherein generating the model includes training the model under constraints requiring: (i) that the sum of the modelled flow rates from each branch of the flow network that contribute to a combined flow after branched flow paths join at one or more nodes must be equivalent to the respective measured combined flow rate, where a measurement of the combined flow is available, and (ii) that training of the model is suspended or modified for certain flow paths when the status of the control points is such that those flow paths will have zero flow, and/or that a flow rate for an individual flow path or branch must be or is encouraged to zero when an associated valve is closed and/or if a pump required for non-zero flow rate is inactive.

Thus, in step (ii) the training of sub-models of the model may be suspended for the respective flow paths. Alternatively, in step (ii) the training of the sub-models of the model may be modified for the respective flow paths in a manner that, based on the inputs to the sub-model, encourages the sub-model to a zero flow for the relevant flow paths without the need to stop the training of sub-models for the respective flow paths in order to replicate said zero flow. That is to say, based on the inputs to the sub-model for the one or more flow paths that have zero flow, the sub-model can itself determine that said one or more flow paths should be represented by a zero flow and thus the sub-model itself tends to zero flow without the requirement that it must be zero. In example embodiments the model of the second aspect is a model comprising one or more data driven models, and/or one or more machine learning models and/or one or more artificial neural nets. The model of the second aspect may be the long-term model discussed above with the data hence being the first set of data and the time period being the first time period. The second aspect may hence be combined with the first aspect. This method for training a model can provide an accurate modelling for an oil and gas network in contexts such as the modelling of the first aspect. The model of the second aspect may relate to a network with features as discussed herein in connection with the first aspect. For example, the flow path(s) may include multiple flow path(s) of the network in which flows from more than one branch of the network have been combined. The one or more nodes may be any junction where flow from multiple branches is combined.

The pump of step (ii), where present, may be any kind of pump that is required to be active for the flow rate at that point within the flow network to be above zero.

The valve of step (ii) above, where present may typically be a choke valve, but it can also be a wing valve, a master valve, a safety valve, a down hole safety valve, a ICV (inflow control valve), down hole branch control valve, branch control valve, manifold valve, richer valve, and/or riser choke valve. The training is suspended or modified and/or the flow rate for the flow path associated with the valve is set as or encouraged towards zero when the valve is closed, or when the valve opening is below a threshold value. In scenarios where the training is suspended, this may be done using a valve activation signal defined as zero when the valve opening is below the threshold (including a closed valve) and defined as 1 in other circumstances. This ensures that, when the training has been suspended for a control point in the form of a closed valve, the model may always correctly handle control points in the form of valves when they are closed, and it makes sure that a closed valve must always be deemed to give no contribution to the summed flow rates from the modelled network of flow paths.

It will be appreciated that, in accordance with the second aspect, the model can advantageously always be trained including all wells and all flow paths, even when wells are shut-in. Every well in the network can be included and the entire model can be trained using a full set of historical production data, and this holistic approach provides particularly good results when used together with the method of the first aspect.

The method of the second aspect may include constraints requiring that all relevant valves and pumps of the flow network have a zero flow rate during training of the model, and/or the method including requiring that training of the model be suspended for associated parts of the flow network, when the relevant valve is closed or the relevant pump is inactive.

Alternatively, the method of the second aspect may encourage all relevant valves and pumps of the flow network toward a zero flow rate during training of the model, and/or the method may include a requirement that the training of the model is modified for associated parts of the flow network such that the flow rate of the associated parts of the network is encouraged towards zero, when the relevant valve is closed or the relevant pump is inactive.

The method of either aspect may include using the model for estimating or predicting flow rates relating to the flow network, for example identifying contributions to the flow from various branches of the flow network and estimating factors relating to those branches. A practical example of this is to identify flow rates relating to different producing wells in an oil and gas flow network where multiple wells are coupled by manifolds and supply flow to a common separator. It is desirable to be able to identify the flow rates of each well along with factors such as the gas oil ratio (GOR) and water cut (WC). The proposed model can be used to estimate such flow rates in a form of virtual monitoring of the network, allowing for flow rates to be determined for the entirety of the flow network even where direct measurements of the flow rates are not available, or are not possible.

The method relates to modelling of the oil and gas network and this may extend to determining the effect of potential adjustments to the control points in order to optimise the performance of the oil and gas flow network. Thus, the method may include identifying one or more proposed adjustment(s) to the control points that would improve the performance of the flow network, for example by increasing or decreasing flow rates. The method may additionally include interacting with the real-world oil and gas flow network by implementing proposed adjustment(s). After an adjustment has been made then new data can continue to be gathered and this can then be used in the method in future modelling, including the real-world effect of the proposed adjustment. In this way the method may be used for optimisation of a flow network in an on-going way such as via an iterative improvement process similar to that described in WO2014/170425.

The control points may be any control device capable of applying a controlled adjustment to the flow network, in particular an adjustment to the flow of fluid within the network. The adjustment may result in changes in any suitable parameter of the fluid, such as a flow rate, temperature, and/or pressure of the fluid. For example, suitable control points may include flow control valves, pumps, compressors, gas lift injectors, expansion devices and so on. The flow control valves may include one or more of ICV (inflow control valves), down hole branch control valves, branch control valves, manifold valves, riser valves, and/or riser choke valves. The basic principle of the above method can be applied with any device that can apply an adjustment within conduits of the flow network. The adjustments need not only be in flow rate, temperature or pressure but may include other parameters, such as the level in a subsea separator and ESP pump setting when the method is used in an oil and gas flow network. The control point(s) and the flow parameter(s) should of course be selected with regard to the adjustment that is applied to ensure that what is being measured will be affected by the applied adjustment. For example, in an oil and gas production flow network, a pressure adjustment will affect flow rate and pressure but may also create output variations in temperature, water cut and so on.

Since the method is applied to an oil and gas production flow network then the control points may include one or more of the following: choke control valve; gas lift valve settings or rates on wells or riser pipelines; ESP (Electric submersible pump) settings, effect, speed, pressure lift, etc.; down hole branch valve settings, topside and subsea control settings on one or more: separators, compressors, pumps, scrubbers, condensers/coolers, heaters, stripper columns, mixers, splitters, chillers, etc. (any equipment that effects production), and the adjustments may be applied accordingly.

The flow parameter(s) that are measured may be any parameter that is affected by the adjustment(s) applied at the control point(s). Hence, the flow parameter(s) may include one or more of pressure, flow rate (by volume or mass or flow speed), level or temperature, all of which are parameters that may vary for an entire volume of a combined flow in response to variations in individual branches of the flow network. The flow parameter(s) could alternatively or additionally include one or more parameter(s) relating to the characteristics of the fluid in the flow network, such as a ratio of gas to liquid, proportions of certain components within the flow, density, pH and so on. In an oil and gas production flow network the flow parameter(s) may for example include water cut (WC), productivity index (PI), Gas Oil Ratio (GOR), BHP and wellhead pressures, rates after topside separation, other rate measurements, e.g. water after subsea separation, other pressures, e.g. manifold line pressure, separator pressure, other line pressures, temperatures (many places along the production system), flow velocities or sand production, amongst other things. It will be appreciated that the flow parameter(s) of interest would not necessarily include all possible flow parameters for a flow network. Instead the flow parameter(s) may include a selected set of flow parameters that are considered important to the performance of the flow network.

The measured flow parameters may include some or all of the flow rates that can be determined using the long-term model. Estimated flow rates from the long-term model can be used to replace measured flow rates in virtual monitoring of the flow network, and predictions relating to measured flow rates can be used to forecast future performance of the flow network. Alternatively the flow rates that can be determined using the long-term model may include some flow rates that are not measured as flow parameters. In this way the long-term model and the combined model can give output information that adds to the measured information about the flow network, both in terms of flow rate estimation and also for flow rate prediction.

The flow parameters may be measured directly, for example by using a pressure or temperature sensor, or alternatively they may be measured indirectly, for example by calculations based on directly measured parameters.

The control points may include gas lift rates. It is preferred to identify both adjustments in gas lift rates and also adjustments applied with choke valves.

It is preferable to measure a plurality of flow parameters and in particular to measure the response for a majority of or all of the flow parameters that are relevant to the assessment of the flow network. This may for example be a majority of or all of the flow parameters relevant to production for an oil and gas production flow network.

When the method is used to find an adjustment for the purposes of improving performance, then the improvement to the performance of the network may be embodied by any advantageous change in any part of the performance of the network. In one example the improvement includes increasing or decreasing one or more output flow rates of interest and these flow rates may hence the focus of the long-term model. The output flow rates may concern production volume or quality, for example.

Thus, the improvement to the performance of the network may involve one or more of: increasing or decreasing one or more output flow rate(s) of interest, increasing the accuracy of the step of determining relationships between the control point(s) and flow parameter(s), adjusting operational parameters of components of the flow network in order to increase the service life of those components or other components of the flow network, or improving another aspect of the flow network not listed above.

The output flow rate(s) of interest, which the method seeks to change in some examples in order to improve performance, may be any flow rate of the oil and gas network. Such a parameter may be a flow parameter of the type included in the measured flow parameters, for example a total combined flow rate or a required pressure for a given production and so on.

In an alternative, which may also be carried out in addition (or in parallel) with the above improvements, the required improvement to the flow network from proposed adjustments to control points may comprise adjusting operational parameters of components of the flow network in order to increase the service life of those components or other components of the flow network, preferably without compromising other aspects of the performance of the flow network. Hence, for example one constraint applied may be that overall production flow rates should remain at or above a given level, whilst another constraint may be that there is a maximum flow rate for given parts of the flow network to avoid over-working certain components and hence extend their service life.

The method may make use of a compact database of data to generate one or both of the long term model and the short term model. This may be a compact database similar to that described in WO2017/077095. Thus, the method may include obtaining the data used to generate the long term model and/or the short term model, and the method of obtaining this data may comprise: (1) gathering historical data and/or live data relating to the status of multiple control points at different branches within the flow network and to one or more flow parameter(s) in one or more flow path(s) of the flow network in which flows of more than one of the different branches have been combined; (2) identifying time intervals in the data during which all of the control points and all of the flow parameters are in a steady state; and (3) extracting statistical data representative of some or all steady state intervals identified in step (2) to thereby represent the original data from step (1) in a compact form. This compacted data may then be used in the data set for the long-term model and/or the short-term model.

Alternatively or additionally the data may take the form of a compact database in which as well as identifying "steady state" intervals there is also identification and categorisation of types of transient data. Thus, in some examples the data used to generate the models is data recorded from an oil and gas flow network, by a method comprising: (1) gathering data covering a period of time, wherein the data relates to the status of one or more control points within the flow network and to one or more flow parameter(s) of interest in one or more flow path(s) of the flow network; (2) identifying multiple time intervals in the data during which the control point(s) and the flow parameter(s) can be designated as being in a category selected from multiple categories relating to different types of stable production and multiple categories relating to different types of transient events, wherein the data hence includes multiple datasets each framed by one of the multiple time intervals; (3) assigning a selected category of the multiple categories to each one of the multiple datasets that are framed by the multiple time intervals; and (4) extracting statistical data representative of some or all of the datasets identified in step (2) to thereby represent the original data from step (1) in a compact form including details of the category assigned to each time interval in step (3).

Thus, the large volumes of data that are recorded for an oil and gas flow network can be categorised and compacted based on the categorisation of datasets within the time intervals and by the use of statistics, and this compacted data can be used for one or both of the models of the first aspect and related aspects discussed above.

The data should be gathered over a period of time in order to allow for multiple time intervals to be established and for sufficient data to be obtained for the required length of time in relation to creation of the model.

The time intervals frame datasets that can be categorised in one of various categories including multiple categories of stable production and multiple categories of transient events. In the case of transient events the categories may be split into two sets defining (i) categories arising in relation to active events, i.e. events that occur due to deliberate intervention on the flow network and (ii) categories arising in relation to passive events, i.e. events that occur unintentionally without any deliberate intervention.

The multiple categories relating to stable production may include: stable steady state production; stable production with flush production from one or more wells; stable production with slugging dynamics present, such as casing heading, severe slugging or other slugging dynamics; stable production where different types of flow regimes are present in different flow paths, such as bubble flow, stable production including sand production, and stable production with drilling mud or chemicals (e.g. scale squeeze or acid stimulation) that need to be cleaned up.

The multiple categories relating to transient events may include one or more active event categories and one or more passive event categories. Active event categories may include: one or more of well testing events, active process events, active well events, and/or active reservoir events. Well testing event categories may include one or more of test separator flow rate testing, deduction testing, 'SmartX' testing as described in WO 2013/072490, multirate testing using choke or gas lift changes, well integrity testing, Downhole Safety Valve (DHSV)-cycle testing, Pressure Build-up (PBU)-testing, Gas-lift Valve (GLV)-testing, and Inflow Control Valve (ICV)-testing. Active process event categories may include equipment maintenance and/or gas backflow into wells. Active well event categories may include one or more of scale squeeze (injection of chemicals into a well to prevent formation of scale), well re-stimulation (injection of chemicals into a reservoir near the well to improve production), well clean-up flow (well production routed away from production separator to clean up well flow), and/or ramp-up after shut-in. Active reservoir event categories may include draw-down pressure dynamics due to well opening and/or build up pressure dynamics due to well closing.

Passive event categories may include one or more of passive process events, passive reservoir/well events or sensor error events. Passive process event categories may include scale formation in production system and/or equipment failure such as reduced capacity at a gas compressor, reduced gas-lift pressure or a system trip. Passive reservoir/well event categories may include one or more of communication between a producing well and a well being drilled, water breakthrough in a reservoir, gas breakthrough in a reservoir and/or sudden changes in sand production. Sensor error event categories may include sensor drift, sensor failure and/or sensor gain drift.

The method may hence include using some or all of the above event types and event categories to categorise the dataset at step (3).

In order to determine which category should be designated for a dataset defined by a time interval of interest then the method may include determining the asset dynamics that are present for the dataset, where an asset dynamic is a phenomena or event that occurs during the time interval for datasets in one or more of the categories. The method may include checking which of multiple asset dynamics are present for the dataset and then selecting a category based on the combination of asset dynamics. The asset and pipeline dynamics may include some or all of: depletion, flush production, build-up, draw-down, pipeline transients due to control changes, slugging dynamics, slug flow, bubble flow, large bubble flow, small bubble flow, laminar flow, plug flow, wavy stratified flow, dispersed bubble flow, annular flow, churn flow, emulsion flow, froth flow, mist flow, production system fluctuation and/or reservoir composition dynamics. Each asset dynamic is either present or not and there might be multiple asset dynamics present at the same time. Asset dynamics includes both reservoir and pipeline dynamics, among other things.

For example, if the dataset is concerned with a time interval that should be categorised as well ramp-up then the data arises in a situation where a well has been closed and is now being opened gradually from 0% up to e.g. 70% choke opening. This might occur over a period of 2-12 hours or more. This period defines a time interval should be categorised as "well ramp up" and will produce a dataset or data-point of statistical data in the compacted database. The asset dynamics for this category include flush production, draw-down and pipeline transient dynamics due to the frequent control changes when the well is opened a step at the time. In some cases there may be slugging dynamics and production system fluctuations but this may not always occur. Further, the reservoir may well be depleting and there will probably be reservoir composition dynamics present, as these are almost always present when an oil field is producing (this is way it produces different last year, compared to today). However, the depletion dynamics are usually slow, and may be neglected (assumed constant) for the time interval of the 2-12 hours where the ramp up event occurs. It will be appreciated that based on defined asset dynamics then a category can be assigned when certain combinations of asset dynamics are present. Thus, determining the asset dynamics that are present can lead directly to a suitable categorisation for any given time interval. In addition, some combinations of asset dynamics may indicate that the time interval includes multiple categories, so the method may include using the step of determining the asset dynamics that are present to check if a time interval needs to be split into two time intervals such that each of these smaller time intervals can be given a different category.

As well as the potential for multiple asset dynamics there may also be multiple categories assigned for the same data points in the data. That is to say, for any given time then there may be overlapping time intervals that define overlapping datasets, where each dataset has a different category. Overlapping in this context includes time intervals that are fully within a larger time interval as well as time intervals that start before another time interval has finished. Some categories are concerned with events occurring over a long time period and defining a large time interval with a dataset having such a category does not preclude defining other time intervals that are overlapping with or are within the large time interval. For example, if a well is shut-in, there will be generated a pressure build-up dataset, which can be given a suitable category referring to the pressure behaviour on the reservoir side of the closed choke valve. However, there might be generated an additional dataset at the same time, such as a steady-state dataset within the same or an overlapping time interval, since other wells may still be producing. Thus, in this example different categories can be assigned to the data with reference to the status of different wells. These two datasets might overlap, but they do not necessarily start and end at the same time. For example, the build-up dataset starts immediately when the well in question is shut-in and may after several days (potentially up to 30 days in some cases), while the stable production dataset may start after 2 hours from shut-in, when pipe-line dynamics have settled out, and this might end after some further hours (or days) when another well/control point is changed. In this instance the two datasets are partly overlapping with regards to time, however the closed valve separates the production system into one part for the closed well and one part for the rest of the production system. The presence of multiple datasets that are overlapping with respect to time and have different categories may occur for other reasons as well. Another example is well ramp-up occurring over a long period during which time there might be other datasets of other categories, such as a sensor error event. These other datasets may overlap with one end of the well ramp-up dataset or they may both start and end within the duration of the well ramp-up dataset.

The methods described herein will provide advantages even for a small number of control points (for example, just two, or three) and a simple flow network. In fact the method using categorisation of data intervals can be used in the situation where there is just a single flow path, since the advantages arising from the compacted form of the data produced at step (3) apply in that situation in the same way as for a situation where there is a more complicated network of flow paths, although there may be a lesser degree of compaction of the data. In some examples the flow network includes branches that are combined, and the method may hence include gathering data for one or more flow parameter(s) in one or more flow path(s) of the flow network in which flows of more than one of the different branches have been combined. Such a situation can provide the additional advantage that the compacted data can later be analysed to determine information relating to the separate flow paths before branches are combined.

The methods described herein may also provide advantages for data covering a relatively small time period and/or data that can be categorised with a relatively small number of datasets of different categories. However it will be appreciated that a longer time period can provide more datasets for the compacted database. Thus, the method may include using data covering a time period of a month or more, or optionally a time period of a year or more. Preferably the data covers a sufficient time period to allow it to be used for the long term model and in some examples the data is used for both of the short term model and the long term model. The method may include, in step (2), identifying at least 100 time intervals in the data, or optionally at least 1000 time intervals. In some cases there may be considerably more time intervals, for example 2000 or more time intervals.

A time interval with a dataset that can be categorised as one of the multiple categories of stable production may be defined as being a time period longer than a predefined minimum during which there has been no change to a control point or a flow parameter outside of a certain threshold. This threshold may be zero, i.e. a requirement that there is no intentional change to the status of the control point.

Thus, identifying a dataset to be categorised as one of the multiple categories of stable production may require that some or all of the control points are kept stable, for example with no changes to the settings for the control points. This may be some of all of a certain set of the control points of interest (with other control points in the flow network being ignored under certain situations), or in some cases it may be all control points that can have an effect on the flow parameters of interest. Identifying a dataset to be categorised as one of the multiple categories of stable production may require that that the expected average value of the relevant flow parameter(s) should not change considerably with time during this interval. For example, there may be a requirement that the average value for a first part of the prospective time interval, as compared to the average value for a second part, does not change by more than 10%, preferably that there are no changes larger than 5%, and more preferably no changes in excess of 2%. The first and second part may be two halves of the prospective time interval, or they may be two parts out of more than two smaller divisions of the prospective time interval. The expected average value may hence be a mean average determined over a time period smaller than the total length of the prospective time interval. Identifying a dataset to be categorised as one of the multiple categories of stable production may alternatively or additionally require that the relevant flow parameter(s) originate(s) from one or more weakly stationary process(es), such that the moments up to the second order depend only on time differences. Among other things, the latter requirement means that the expected value of the flow parameter(s) should not change considerably with time during this time interval.

In an example method, determining if a flow parameter does not change considerably with time for a given time interval may include fitting linear and quadratic lines to all the data points for the flow parameter during the interval. The linear line will have a constant term and a linear term. The quadratic line will have a constant term, a linear term and a quadratic term. The linear and quadratic terms and/or lines may be used to determine if a dataset should be categorised as one of the multiple categories of stable production or if it should be categorised in some other way. For example, a large linear and/or quadratic term may indicate a transient event.

If a flow parameter holds values that oscillate around an expected average value throughout a time interval then if the total interval were to be divided into multiple intervals, for example two intervals, the expected average values for each of the smaller intervals would be approximately equal to the expected average value of the total time interval. If it changes considerably then this is an indication that there is not stable production. Consideration of the expected average value, e.g. the mean for an oscillating measurement, also provides a way to identify if a parameter originates from a weakly stationary process. In a preferred method, if any relevant flow parameter has measurement values with noise that oscillate around an expected average value that is changing significantly during a possible dataset to be categorised as one of the multiple categories of stable production then the interval is not defined as stable production, whereas if all relevant flow parameters have measurement values with noise that oscillate around expected values with no considerable variations in the expected values for the flow parameters during the interval, then this is identified as a dataset to be categorised as one of the multiple categories of stable production. Thus, as discussed above, there may be a requirement that the average value for a first part of the prospective dataset, as compared to the average value for a second part, does not change by more than 10%, preferably that there are no changes larger than 5%, and more preferably no changes in excess of 2%. The first and second part may be two halves of the prospective time interval, or they may be two parts out of more than two smaller divisions of the prospective time interval. This may be applied to multiple flow parameters and a dataset to be categorised as one of the multiple categories of stable production for a set of control points and flow parameters may be defined as being a data from a time interval when there are no changes to any of the control points, and all of the flow parameters affected by the control points have expected average values that do not change considerably with time.

Identifying a time interval during which there is stable production may include requiring a minimum time period of 1 hour, such as a minimum time selected from the range 1 to 24 hours. In some examples identifying stable production requires that there are no changes outside of the set thresholds for at least 2 hours before a stable production time interval may start, or for a time period of up to 12 hours. It is preferred to ensure that a dataset to be categorised as one of the multiple categories of stable production is identified in step (2) only when the flow parameter(s) of interest are stable. Hence, the time interval defining a dataset to be categorised as stable production may be deemed to begin only when the flow parameter(s) have stabilized after a transition due to changes in control points. This allows for any dynamic transition effects to settle down. The time interval defining a dataset to be categorised as stable production may not be allowed to continue after a point where new changes are made to any of the control point(s). When changes are made to the control signals, there will be a transition period and a shift in the expected value of the flow parameter. The data in this period may give rise to one or more time intervals where the category is one of the multiple categories relating to different types of transient events. Subsequently the production may stabilise and hence a new time interval defining a dataset to be categorised as stable production can be found.

Step (4) may include gathering the statistical data in tabular form, and optionally storing the data, for example via a computer. Thus there may be a compact data table output from step (3), and this compact data table may take the form of a database or similar that is stored in a computer memory either permanently or temporarily. Obtaining the compact data table may include, in step (2), identifying multiple time intervals in which the control points and the flow parameters of interest can be designated as being in one of the categories; in step (3) assigning the category to each of the datasets of the multiple time intervals; and then in step (4) extracting statistics representative of each of the datasets.

Thus, in a simple example, several minutes of data points for choke valve openings that do not change could be replaced by a statistical representation of a single stable production dataset in which a flow parameter or a set of flow parameters with certain value(s) are equated with a given set of choke valve openings. In a more sophisticated example, additional statistical data are derived from multiple time intervals and tabulated to provide a compact data table representing large amounts of the original data without loss of any detail that could be relevant to assessment of the flow network.

A data table of both stable production and transient events may hence be produced. This may include information about the stable production time intervals such as category, start time, duration and/or statistical information such as one or more of mean, median, variance, constant term, linear term, r-squared, and/or number of sample points. It may also include information about the transient event time intervals such as category, start time, duration and/or statistical information relating to the transient event. This statistical approach allows for a highly effective compression of the original data, and also produces sets of co-ordinates mapping the status of control points with the values of flow parameters in terms of absolute values.

Obtaining the compact data table may include identifying regions of data where adjustments have been made to some of the control points whilst the status of the other control points has remained unchanged. The adjustments may be step changes, or they may be excitations such as oscillations as described in WO2014/170425.

The method may include use of the time intervals identified at step (2) in the assessment of factors relating to performance of the flow network. This may be done by determining relationships between the status of the control point(s) and the flow parameter(s) by generating one or more local model(s) for the system based on the status of the control point(s) and the flow parameter(s) based on the time intervals. In some cases such models may be based on the time intervals with datasets categorised as stable production without reference to the datasets categorised as transient events. The determination of relationships may advantageously be done based on the statistical data extracted at step (4). This allows for an efficient processing of the data, since the models are based on the compact data provided via the extraction of statistics. Thus, the data table may be used in step (4) in order to identify relationships between absolute values for the status of the control points and for the flow parameters and to allow a local model to be formed that represents the relationships. For example, the local model may be able to predict the effect of adjustments to one or more control points on the flow parameters.

In some circumstances the compaction of the data at step (4) is not essential and in fact the determination of relationships and the creation of local models may also be done directly based on the steady state intervals, with optional use of step (4) in a preferred implementation. Thus, viewed from a further aspect the invention provides: a method of assessment of an oil and gas flow network, the method comprising: step (1), step (2) and step (3) as above, optionally step (4); determining relationships between the status of the control point(s) and the flow parameter(s) by generating one or more local model(s) for the system based on the status of the control point(s) and the flow parameter(s) as well as the categorised datasets; and, preferably, using said relationships in the assessment of factors relating to performance of the flow network. This method may use only the datasets that are categorised as stable production.

Step (1) may include gathering data measured directly in relation to the status of the control point(s) and the flow parameter(s). This type of 'raw' data is often gathered into a real-time database by an operator for a flow network, and is stored as a record of operation of the flow network. The presently proposed methods allow effective analysis and utilisation of such data, which is often left unused, or is only used in an inefficient way due to the large size of the database. Step (1) may further include gathering data obtained by the use of observers in relation to the measured data referenced above, for example through simple calculations applied before more complex analysis is performed in later steps of the method and as discussed below. Various types of observers can be utilized, for example mass balance equations, choke models and/or Kalman filters.

The present invention extends in further aspects to a model of an oil and gas flow network produced using the method of the first or second aspect, optionally including further features of such methods as discussed above. The invention also extends to the use of such models for optimisation of oil and gas networks or for any other purpose.

In further aspects, the invention provides computer systems for modelling of an oil and gas flow network, wherein the computer systems are configured to perform the method of the first or second aspect, optionally including further features of such methods as discussed above.

The computer systems may further be arranged to gather the first set of data and/or the second set of data, and/or to process data for the first set of data and/or the second set of data to form a compact database.

Thus, the computer system may be arranged to: (1) gather historical data and/or live data relating to the status of multiple control points at different branches within the flow network and to one or more flow parameter(s) in one or more flow path(s) of the flow network; (2) identify time intervals in the data during which all of the control points and all of the flow parameters are in a steady state; and (3) extract statistical data representative of some or all steady state intervals identified in step (2) to thereby represent the original data from step (1) in a compact form. This compacted data may then be used in the data set for the long-term model and/or the short-term model.

The computer system may be arranged to categorise the data within the compact database as discussed above. Thus, the computer system may be arranged to (1) gather data over a period of time, wherein the data relates to the status of multiple control points at different branches within the flow network and to one or more flow parameter(s) of interest in one or more flow path(s) of the flow network; (2) identify multiple time intervals in the data during which the control point(s) and the flow parameter(s) can be designated as being in a category selected from multiple categories relating to different types of stable production and multiple categories relating to different types of transient events, wherein the data hence includes multiple datasets each framed by one of the multiple time intervals; (3) assign a selected category of the multiple categories to each one of the multiple datasets that are framed by the multiple time intervals; and (4) extract statistical data representative of some or all of the datasets identified in step (2) to thereby represent the original data from step (1) in a compact form including details of the category assigned to each time interval in step (3).

The categories, control points and/or flow parameters may be as discussed above in relation to the method aspects.

The computer system may be arranged to interact with the oil and gas network and for example it may include a controller for controlling the status of the control points. The controller may be able to control the status of the control points to apply adjustments by sending control signals to the control points. In some preferred embodiments, the invention extends to an apparatus including the control points as well as the computer system for modelling the flow network. The invention may be embodied as an oil and gas flow network including the computer system for modelling the oil and gas flow network.

Viewed from a yet further aspect, the present invention provides a computer program product comprising instructions for execution on a computer system arranged to receive data relating control points and flow parameters in a flow network; wherein the instructions, when executed, will configure the computer system to carry out a method as described in the first aspect above, or in any of the alternative method aspects described above.

The computer program product may configure the apparatus to carry out method steps as in any or all the preferred features set out above. The computer system may include features as discussed above.

Certain preferred embodiments are discussed below, by way of example only, with reference to the accompanying Figures, in which.

It is required to more accurately model oil and gas flow networks and to better capture the technical features of the oil and gas flow networks within a model. The inventors have identified a problem arising from the so-called "reservoir effect", where pressure and temperature variations occur due to depletion of the reservoirs that supply the oil and gas flow network. It is desirable to use data over a long time period in order to better characterise the network and allow for more accurate training of models. However, data over a longer time period is in some ways contaminated by the reservoir effect, and as a result a longer-term model will not necessarily accurately predict the effect of proposed control changes on output flow rates, since the data used to judge the changes can include effects from production changes as well as the reservoir effect.

It is proposed to use a method of modelling for the oil and gas network using a combination of a long-term model based on a first set of data relating to measurements of the flow parameter(s) and the status of the control points over a first, longer, period of time, and a short-term model based on a second set of data relating to measurements of the flow parameter(s) and the status of the control points over at least one second, shorter period of time. The long-term model describes the relationship between flow rates, the status of control points, and measured flow parameters including pressure and/or temperature, and this can take account of the reservoir effect as it occurs over the longer time period. The short-term model describes the relationship between the status of control points and flow parameters including pressure and/or temperature and since this uses data gathered over a shorter time period then the reservoir effect is less pronounced and can largely be disregarded. The short-term model can hence be used to determine the effect of proposed control point changes on pressure and/or temperature within the system, i.e. the effect on flow patterns, and this can be combined with the long-term model by using the determined pressure and/or temperature changes from the short-term model along with the proposed changes to the control points as inputs to the long-term model and then using the long-term model to determine flow rate changes that will result from those inputs. The combined model therefore allows for estimation of flow rates in real time as well as prediction of the effects of changes in the status of one or more of the control points.

Figure 1:
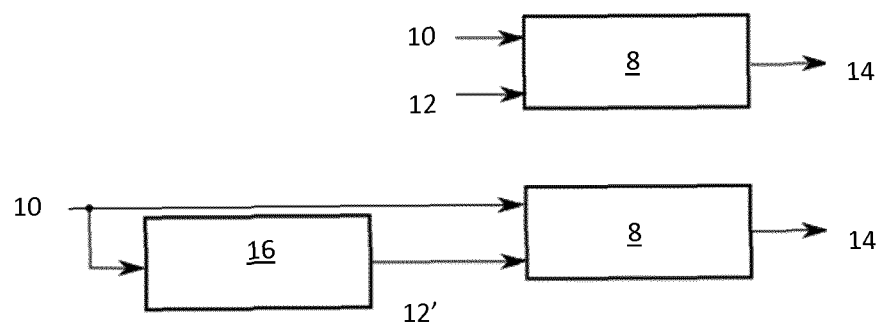
FIG. 1 illustrates a proposed model for an oil and gas flow network.

FIG. 1 shows an example structure for elements of the proposed modelling when implemented using artificial neural network models. In a first modelling arrangement, as shown in the upper part of FIG. 1, a neural net model for rate predictions 8 receives inputs in the form of control point statuses 10 and measured parameters 12 such as pressures and/or temperatures. This neural net 8 outputs predicted/estimated flow rates 14 and it forms the long term model described above. In a second modelling arrangement the neural net model for rate predictions 8 is used along with a neural net model for partial state predictions 16, which equates to the short term model described above. The neural net model for partial state predictions 16 receives inputs in the form of control point statuses 10 and can predict changes in parameters such as temperatures and/or pressures. These predicted parameters 12' can be used as an input to the neural net model for rate predictions 8 so that the combination of models can be used to allow for a prediction of the impact of proposed changes in control points that takes account of the reservoir effect.

Figure 4:
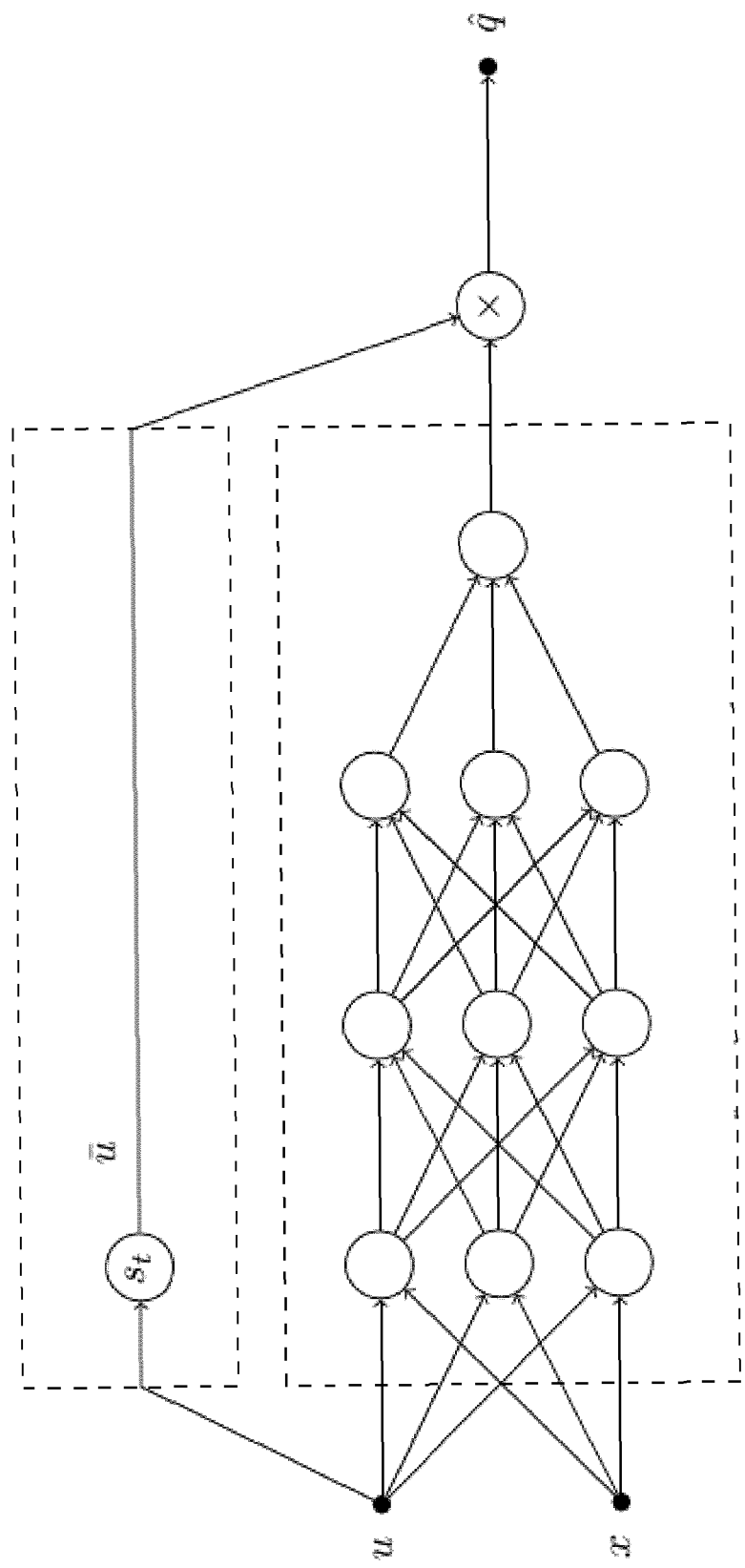
FIG. 4 illustrates the use of a choke valve activation signal.
Figure 5:
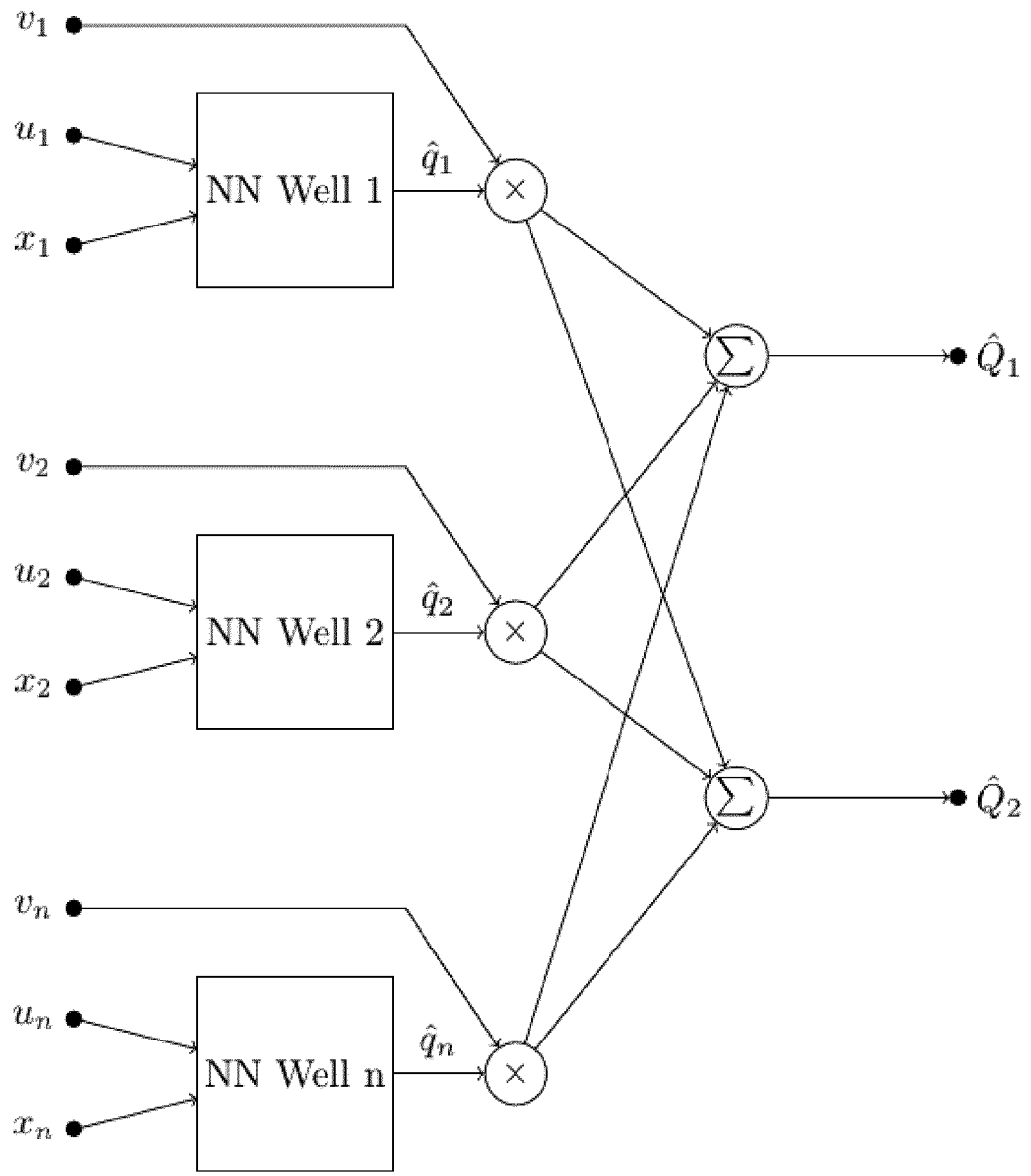
FIG. 5 shows neural net modelling used to model a network of n wells.

The training of these models 8, 16 can include features as shown in FIG. 4 and the elements of the model may be assembled into a larger model as shown in FIG. 5. The hierarchy of the proposed models for this example is outlined below, starting with the smallest model components:

1. For each well a feed-forward neural network (FFNN) for rate estimation is assembled. These networks have a programmed on/off logic which allows training of the network to be activated/deactivated as the choke or other well valves are opened/closed, as shown in the upper part of FIG. 4 (discussed below).
2. The individual well FFNNs are combined with routing logic to obtain a single FFNN model of the production system, which is the long-term model described above (i.e. the neural net model for rate predictions 8), and an example of this is shown in FIG. 5. This long-term FFNN estimates flow rates based on measured controls (choke openings, routing valve openings, pump speeds, etc.) and states (pressures, temperatures, rates). A key feature of the model is that it ensures valid mass balances in the system. The long-term FFNN model is trained on data spanning a relatively long time period, for example 6 months to 3 years of historical production data, including well tests.
3. A short-term FFNN is used describing the relationship between choke changes and changes in production system states (pressures and temperature) is trained on historical measurement data. This model is trained using data from a shorter window of 1 week to 6 months to avoid corruption due to long-term reservoir dynamics. This is the model for partial state prediction 16 shown in FIG. 1.
4. The two pre-trained FFNNs in 2) and 3) are combined as discussed above in order to obtain a model for flow rate prediction, i.e. sensitivity of flow rates on control changes. The short-term model for partial state prediction allows for a complete set of inputs for the long-term model for flow rate prediction.

The long-term model can be used for real-time virtual flow metering (flow rate estimation). The combined model can be used for daily production optimization (flow rate prediction).

Figure 2:
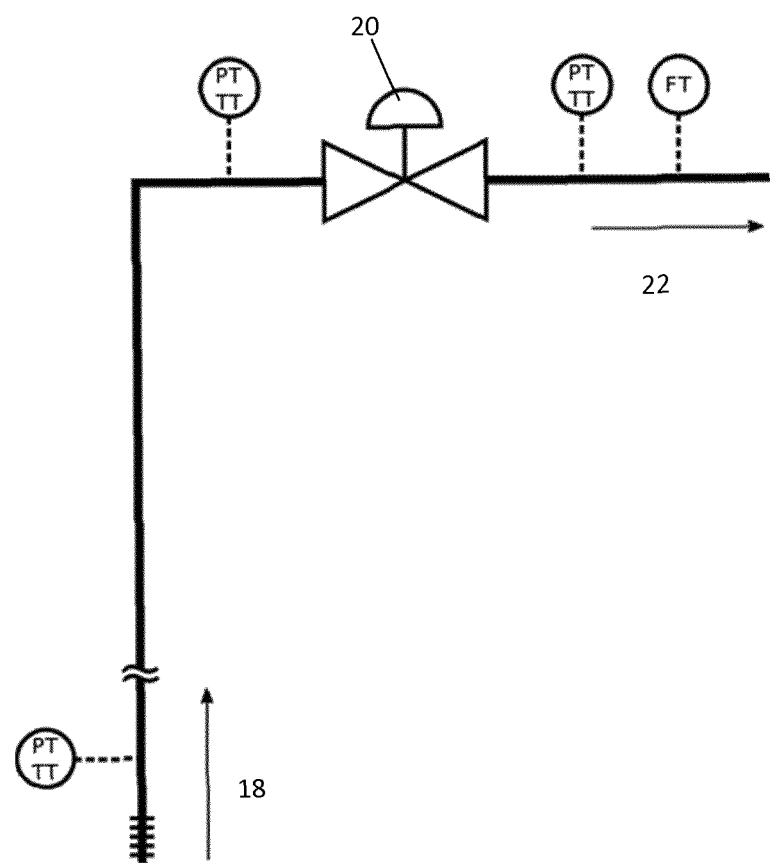
FIG. 2 shows a typical production well.
Figure 3:
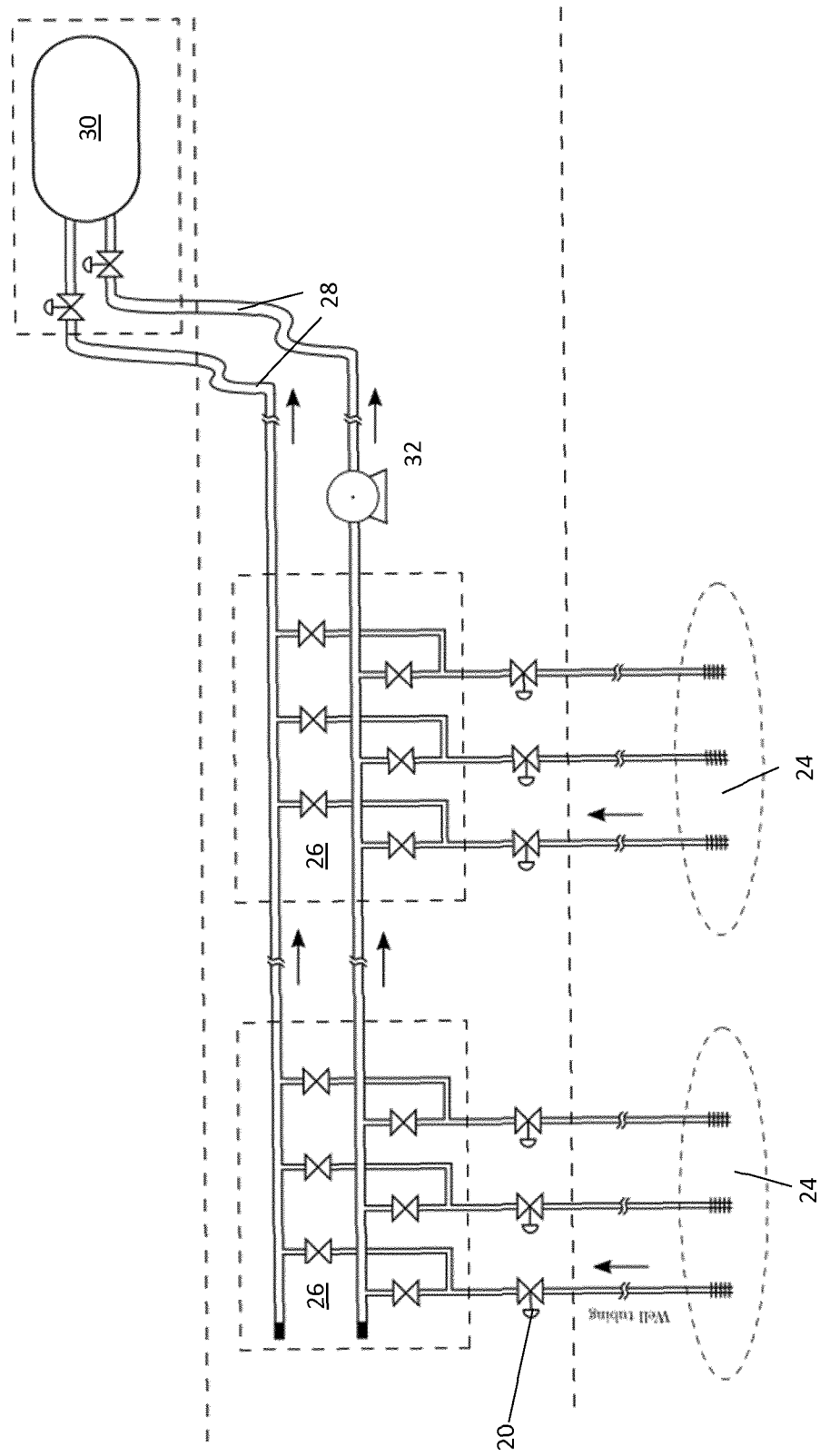
FIG. 3 shows a production system including an oil and gas flow network of the type that can be modelled using the approach described herein.

The proposed models are for modelling of an oil and gas flow network that typically includes several production wells along with related flow paths and control points as discussed above. FIG. 2 shows a typical set-up for a production well. As shown in the Figure, incoming flow 18 from a reservoir or from an earlier branch of the flow network flows toward a control point in the form of choke valve 20. The outgoing flow 22 will typically pass toward a production manifold. Multiphase flow is controlled by adjusting the opening of the choke valve 20. The state of the well is measured by pressure and temperature sensors (transmitters PT, TT) located bottomhole and at the wellhead, upstream and downstream the choke valve. Furthermore, some well may have a multiphase flow meter FT installed. A production system consists of several wells connected to one or several production manifolds. In some production systems, the well can be routed to one of several pipelines leading to one or several topside separators. FIG. 3 illustrates an example for a subsea production system with two reservoirs 24 and multiple sets of well tubing coupled via two manifolds 26 into two risers 28 that are producing to a common separator 30. There is a subsea pump 32 installed in the production line to one of the risers. The system has two daisy-chained manifolds 26 that may route the well flows. There are six production wells in total, with three wells producing to each of the two manifolds. It will be appreciated that even with this relatively small installation there is a very complex flow network. Choke valves 20 and other valves as well as pumps are used to control the flows through the various branches of the flow network.

A sensor in the production system measures either a control setting or a system state. Control settings refer to measurements of the setting of any valve, choke, pump, compressor, or active component that controls the flow through the production system. System states refer to properties of the physical state of the system as a response to the control settings. Examples of commonly measured production system states are pressures, temperatures and flow rates.

System states are only measured point-wise at the sensor locations. Elsewhere, the system state must be inferred from the point-wise measurements using a model of the system. A virtual flow metering system, as is provided by the long-term model discussed above, combines the model of the system with live measurement data to infer unknown system rates in real-time. This is particularly useful for production systems that lack flow rate measurements, and relies on a common flow metering facility (for example, a single topside separator).

If all components of the coupled system were static, the controls at any time instant would be sufficient to explain the state (flow rates). However, due to the multitude of dynamics in the coupled system (reservoir and production system) the state of the system at a time instant cannot be explained by the controls alone. In particular, as noted above, the effects of well depletion also have an impact and this means that a single model has been found to be ineffective in many circumstances.

To obtain a representation of each production well the well flow rate is modelled by utilizing the state surrounding the choke valves, up-stream and down-stream pressures and temperatures combined with control variables such as choke opening and gas-lift rates. This allows a decoupling of the well from the rest of the system by using the up-stream and down-stream pressures and flow composition (gas to liquid ratio) as boundaries. If needed, temperature serves as a proxy for composition (since composition is rarely measured reliably), but this is only required if the composition changes significantly.

Example: Choke Controlled Well

Consider a well with choke opening u and states (pressures and temperatures) x, and unmeasured rate q. A feed forward NN model for predicting the flow rates is shown in FIG. 4, with flow rate predictions denoted q̂. The main part of the NN model consists of a network of rectified linear units (ReLU) activation units. A special feature of the model is the modelling of the choke via a choke activation signal defined as follows:

$$\bar{u} := s_t(u) = \begin{cases} 1, & u > t \\ 0, & \text{otherwise} \end{cases}$$

In this example, the choke activation signal is 1 if the choke opening is above a threshold value t, and 0 otherwise. The choke activation signal is used during training of the model to ensure that training for a flow path is suspended when there is a zero flow through that part of the well model, for example where the choke valve is closed or where the opening is below a threshold value.

The well models can be trained individually using well tests, in which q has been measured. Or, they can be trained simultaneously, using topside measurements, as described in the next section.

The models for each well and for other elements of the flow network are combined together to form a production system flow model, which can form the long-term model referenced above. This model estimates flow rates for all wells given the system state. The production system is taken as a set of wells and their connections up until the point where flow rates are reliably separated and measured. Usually this would cover most of the wells and topside facility of an asset. Simple mass balances are used to connect the individual well models from the previous section into a sum of wells that produce towards the same separator. Complex fields may have the option to route wells to different separators. The model is trained on individual tests and combined top side measurements from all routing configurations.

The long-term model can be used to predict unmeasured well rates. It cannot, however, be used to predict rates for controls in which the states have not been measured. Estimates of individual well rates and total (separator) rates are obtained by evaluating the neural network for a given set of controls and states.

Example: Network of n Wells and Two Separators

A model for a network of n wells and two separators is illustrated in FIG. 5. Additional routing tensors v are included to capture the routing of wells to different separators over time. Estimates of individual well rates and total (separator) rates are obtained by evaluating the neural network for a given set of controls and states. The neural network model of the production system lends itself to a holistic modelling approach in that all wells are included and trained on all historical production data. The novel on/off programming of the wells described in the example above allows for this holistic approach since shut-in wells will not be trained and will give a zero contribution to the total rate.

In order to make best used of the long-term model it is combined with a short-term model as discussed above. The short-term model is a model that relates changes in controls (such as chokes) to changes in state (pressures and temperatures) is dependent on the boundary conditions of the system. In example embodiments, it is trained using data from a single, relatively short time period so that the reservoir effect is reduced compared to the long-term model. For a production system, the boundaries on one end are given by the reservoir and the boundaries at the other end are given by the topside production facility. The facility conditions are usually well known and stable. The reservoir conditions are usually unknown and dynamic. There are several strategies for dealing with these boundary issues, and they differ for topside and reservoir.

Reservoir boundaries are pressure and composition. As the reservoir is drained, these boundary conditions change. A consequence of this is that, given time, the system state will change even if the controls do not and, the same change in controls will not produce the same state change today as it did one year ago. The easiest way to handle these boundaries is to build the model over a short enough time span to allow the assumption of constant values. This gives a typical time span of 1 week to 6 months. A more complex approach is to attempt to capture the slow dynamic of the reservoir and estimate the changes in boundary values. This can be attempted using, for instance, Kalman-filtering.

Topside boundaries are governed by control settings and export pressures. These are usually measured and known. These boundaries will act sporadically and in steps, as opposed to the slow but steady changes in reservoir conditions. For example, if a number of wells are suddenly closed or a riser choke is adjusted, the boundary conditions observed by the remaining wells will change almost instantly (minutes to hours, but this depends on system dimensions). The easiest way to handle these boundaries is to limit the model to a single operating point, e.g. only allow small changes in controls. A more complex approach is to attempt to identify similarities between operating points and model several points simultaneously. This can be done if there is sufficient instrumentation at the topside facility (e.g. riser and template pressures).

Example: Static Control to State Model

A simple FFNN is used to describe the relationship between choke changes and changes in production system states (pressures) for a single operating point. Training data is limited to a shorter window of 1 week to 6 months where other operating points have been removed. The model is likely going to be limited in scope, and PCA techniques can be used on control variables to restrict the subspace in which the model is considered valid.

In order to predict flow rates from control changes, the short-term Control-to-State (CS) model and the long-term State-to-Flow-Rate (SFR) models are combined to create a complete model of the production system from a control point of view.

A composite model can be built and used as follows:
1. Observe the current operating point and state.
2. Get a short-term (CS) model for the operating point and state.
3. Get a long-term (SFR) model.
4. Evaluate the CS model to get the estimated state change.
5. Combine the estimated change with the observed state to find the new, predicted state.
6. Evaluate the SFR model using the control set point and predicted state.

It should be understood that whilst in the examples above the short-term model and the long-term model are both implemented as neural networks this is not the only option and other suitable modelling systems can be used. For example, the long-term model could be a physics based model, and the short-term model could be a local linear regression model.

The example systems described herein may analyse and process sensor data from an oil and gas flow network to allow for estimation of rates in virtual monitoring, as well as prediction of rates based on potential changes to control points of the network. Proposals for changes to the real-world network may be output from the model in order to automate dynamic "best practice" recommendations for decision makers and calculate key well parameters for separate wells without shutting down production. The proposals add to and build on the advances described in WO2013/072490, WO2014/170425 and WO2017/077095 in relation to recording data as well as optionally for using that data in the context of well-testing and production optimisation. This technology can be implemented as an online solution that allows for continuous operation during production and during well testing, as well as real-time recommendations for optimization.

The system can receive historical and live data from a production installation and store the data in a database. In an example of production optimization this data is analysed to automatically produce recommendations for adjustments to production variables. These recommendations are presented to the user, which may be the production engineer and/or operator, and they can use their judgement in how they implement the recommendations. The required production changes and/or experiments may be implemented through the existing control systems for the production installation, and the reaction of the production parameters to the changes/experiments is recorded for use in further cycles of the process. The system can hence be used for iterative improvements and on-going optimisation. Another example use of the system is to identify and reduce potential risks to the integrity of the flow network, reducing down time and hence increasing output by maximising the up time.

The proposed system processes both the historical data stored in the real-time database as well as the live data streaming into the database. Example embodiments use a compaction strategy to collect and save relevant information about the production system in a more compact form in a so called compact database. Statistical analysis is used to calculate statistical information for steady state production intervals, i.e. intervals where the data represents the status of the flow network in an absolute steady state when there is no change to the system controls (e.g. no change to choke valves in an oil and gas network). A method for identifying steady state production intervals is described in WO2017/077095, for example. Such information provides a link between absolute values of control variables, and absolute average production values for the steady state interval values. Where changes are occurring, then information for derivative states of the system can be obtained. For example, where oscillations or recurring step changes have been introduced to the system controls, frequency analysis, e.g. the Fourier transform, can be applied to obtain steady state derivative information. In these situations absolute value information is not available for well specific measurements, but derivative information can usefully be obtained to represent the impact on the outputs of the system that arises from a change in the system control variables. In this situation the derivative state information is kept.

All generated information of interest is stored in a compact database. The information that is stored includes statistical information extracted from datasets framed by time intervals of interest as well as a category for each dataset. The categories may include categories relating to stable production such as: stable steady state production; stable production with flush production from one or more wells; stable production with slugging dynamics present, such as casing heading, severe slugging or other slugging dynamics; and stable production including sand production. The categories also include categories relating to transient events including one or more active event categories such as: well testing events, active process events, active well events, and/or active reservoir events; and/or one or more passive event categories such as: passive process events, passive reservoir/well events or sensor error events.

The selection of the category includes determining what category applies to a given dataset by determining what combination of asset dynamics are present for the dataset, where an asset dynamic is a phenomena or event that occurs during the time interval for datasets in one or more of the categories. The asset dynamics (including reservoir dynamics, pipeline and production system dynamics, among other things) used in example embodiments include some or all of:

depletion, flush production, build-up, draw-down, pipeline transients due to control changes, slugging dynamics, slug flow, bubble flow, large bubble flow, small bubble flow, laminar flow, plug flow, wavy stratified flow, dispersed bubble flow, annular flow, churn flow, emulsion flow, froth flow, mist flow, production system fluctuation and/or reservoir composition dynamics.

In the prior art asset dynamics or similar concepts are used, but these are determined manually by engineers who inspect measurement data to find the time spans of interest. An example: in order to determine a suitable start time for a well test, the engineer might inspect pressure signals to see when they stabilized and take this as the starting point.

The categorisation used in the proposed method includes detecting all of or a subset of all possible active asset dynamics. It consists of two main steps. Firstly, individual signal behaviours are classified into broad groups, including stable, oscillating or transient. These signal behaviour types may jointly be referred to as signal behaviour profiles. Secondly, these signal behaviour profiles are combined and logical rules are applied to decide which of the asset dynamics are active at a given point in time. As well as stable, oscillating and transient signal behaviour profiles other behaviours could include various degrees of failure, such as missing data or bad values. Signals can be raw data measurements, derived signals (such as the sum of flow rates), or estimated signals (such as the outputs of a Kalman-filter). The signals are grouped into control signals (that is signals that the operator may change to alter the behaviour of the network, such as choke control valves or gas-lift rates), and state signals (that is pressure, temperature and rates).

Classifiers are tailored to match signal behaviour profile characteristics found in oil and gas assets. Examples of such characteristics are:

- Piecewise constant signals with outliers, but otherwise no noise, such as chokes. These Signals can have a low sample rate (several minutes between samples).
- Dynamic, high precision, low noise signals such as pressure and temperature. These Signals often have a high sample rate (few seconds between samples).
- Dynamic, high disturbance signals such as flow rates. These signals often have a medium sample rate (seconds to minutes between samples).

Convolutional Neural Nets and/or LSTM-Nets combined with signal specific pre-processing are used to build a suitable classification algorithm. To classify each sample (e.g. stable, oscillating or transient), the classifiers must look at the surrounding samples to determine its context. Since it is inconvenient to look at all data simultaneously, a windowing approach is used. The size of this context window must be scaled to the signal behaviour and the asset dynamics, e.g. to separate transients and oscillations the context must be big enough to capture the oscillation period. All samples inside a window are classified, but the middle samples will be more certain than those towards the edges. For each sample it is also returned a certainty or uncertainty measure for the classified signal behaviour.

If one wants to determine what signal behaviour or asset dynamics are active at a certain point in time, it would be natural that this point in time will be in the middle of the context window. However, more than the middle point might be used.

If the classifier is used in a sliding window approach, it would be natural to only keep the middle sample in each iteration. In a real-time application it is possible to use the classification for the most recent samples, but the user must be aware that the classification can be changed when new data arrives.

The general framework/algorithm for the signal behaviour classification is outlined below:

1. Get samples inside a context window
2. Apply pre-processing (e.g. resample to uniform sample rate)
3. Run a classification algorithm on the individual signal data in the window, and classify/label all data points
4. Return/store label information, i.e. stable, oscillating, transient, and optionally the statistical certainty of this label (for middle sample or all samples)
5. Optional: Advance window and repeat in a real-time setting.

When the signal behaviour profile is known then logical rules are applied to decide which of the asset dynamics are active at a given point in time. The logical rules can vary for different signal behaviour profiles. Once the combination of active asset dynamics is known for a given datapoint or dataset then a suitable category can be assigned. There may be a category associated with each possible combination of active asset dynamics. An indication of the category is stored in the compact database along with statistical data relating to the dataset.

The compact database is effectively a compressed form of data showing the information of interest in the original data but requiring much less data as a whole since time intervals in the original data are represented by statistical information. Thus, a greater amount of historical/recorded data can be kept and processed with much less of a burden on the amount of data storage and data processing capability that is required.

The information in the compact database enables various further steps, for example identification and adjustment of simple data driven linear or quadratic input-output models within several model-based application areas. Such models can provide representations of aspects of the flow network and allow for a prediction of how proposed changes to control variables will affect the performance of the flow network. Based on the latest information added to the compact database, the input-output models of the applications are continuously updated.

Production improvement is a type of high-level application. While conventional optimization strategies utilize advanced simulators and aim for the globally optimal solution immediately, the information in the compact database can be used to build local input-output models, with emphasis on derivative information. These models can either be purely data driven, or they can be augmented by first order physical models such as conservation laws (e.g. conservation of mass). This model can then be used to optimize the production in a neighbourhood around the current operating point, in order to provide a new and improved operating point.

The use of continuous parameter estimation and model calibrations also enables other model-based applications that would otherwise be cumbersome or subject to large errors. For instance, rate estimation and/or gas-oil ratio (GOR) and water cut (WC) approximations can be made possible due to better accuracy in well-related information (and up to date choke models). This enables effective estimation/calculation of parameters that until now could only be performed by building a parallel and separate test production system or by closing one well at a time.

Certain example embodiments of the invention are defined in the following numbered clauses, with the scope of the currently claimed invention being set by the subsequent claims.

Clauses

1. A method of modelling an oil and gas network, the network comprising multiple branched flow paths, such as in multi-zonal wells and/or networks including multiple wells, and multiple control points at different branches, wherein modelling the network includes modelling of the variation of one or more flow parameter(s) in one or more flow path(s) of the network; the method comprising:

generating a long-term model using a first set of data relating to measurements of the flow parameter(s) and the status of the control points over a first period of time, wherein the long-term model describes the relationship between flow rates, the status of control points, and measured flow parameters including pressure and/or temperature;

generating a short-term model using a second set of data relating to measurements of the flow parameter(s) and the status of the control points over a second period of time, wherein the second period of time is shorter than the first period of time, and wherein the short-term model describes the relationship between the status of control points and flow parameters including pressure and/or temperature; and combining the short-term model with the long-term model by: using the short-term model to determine pressure and/or temperature values that will result from the status of one or more control points or from proposed changes to those control points; using the determined pressure and/or temperature values from the short-term model along with the status of, or the proposed changes to, the control points as inputs to the long-term model and then using the long-term model to determine flow rate values that will result from those inputs; and thereby obtaining a combined model allowing for estimation of flow rates in real time as well as prediction of the effects of changes in the status of one or more of the control points.

2. A method as in clause 1, wherein the first time period has a length such that a reservoir effect arising from depletion of the reservoir over time has an impact on the flow parameter(s) during the first time period; the second time period has a lesser length than the length of the first time period such that the reservoir effect is reduced for the second time period and the short-term model is affected to a lesser degree than the long-term model; and the output from the short-term model acts as an input within the long-term model so that the short term impact of control point adjustments can be overlaid with the longer-term data that includes the reservoir effect in order that accurate predictions and/or estimations can be made using the combined model.

3. A method as in clause 1 or 2, wherein the first time period fully overlaps the second time period and thus includes all of the data from the second time period as well as added data going further back in time, with the first, longer, time period extending backward in time from a reference time and the second, shorter, time period extends backward in time from the same reference time.

4. A method as in clause 1, 2 or 3, wherein the length of the first time period is at least twice the length of the second time period, or at least three times the length of the second time period.

5. A method as in clause 4, wherein the length of the first time period is at least five times the length of the second time period, optionally at least ten times the length of the second time period.

6. A method as in any preceding clause, wherein the first time period covers a time during which 100 or more changes are made to control points, optionally 1000 or more; and the second time period covers a time during which the number of changes to control points is less than a half of the number for the first time period, optionally less than a fifth of the number of changes.

7. A method as in any preceding clause, wherein the second time prior is three months or less and the first time prior is two years or more.

8. A method as in any preceding clause, wherein the long-term model and/or the short-term model use both pressures and temperatures of flow paths within the network.

9. A method as in any preceding clause, wherein the long-term model is configured to ensure valid mass balances in the network; and wherein generating the long-term model includes training the model using the first set of data with the first set of data including measurements of total flow rates through the network and/or a sub part of the network, and the training requiring that the sum of the modelled flow rates from each branch of the flow network that contribute to a combined flow after branched flow paths join at one or more nodes must be equivalent to the respective measured combined flow rate, where a measurement of the combined flow is available.

10. A method as in clause 9, wherein generating the long-term model includes training the model with a requirement that training of the model is suspended for certain flow paths (e.g. training of a sub-model is suspended) when the status of the control points is such that those flow paths will have zero flow, and/or that a flow rate for an individual flow path must be zero when an associated valve is closed or when an associated pump is inactive, such that input parameters such as pressure and/or temperature for this flow path can be above zero, but the output flow rate must be zero so that the flow paths associated with closed valves or inactive pumps have zero flow during training of the model.

11. A method as in clause 10, wherein the network includes one or more pumps that are required to be active for the flow rate at that point within the flow network to be above zero, and during training of the model the flow rate for the flow path associated with the pump is required to be zero if the pump is inactive.

12. A method as in clause 10 or 11, wherein the network includes one or more valve(s), such as choke valves, where the valves control flow rate through flow paths at branches of the network and where the flow rate will be zero when the valve is closed, and during training of the model the flow rate at the flow path associated with the closed valve is required to be zero when the valve is deemed to be closed, which may include when the valve opening is below a threshold value, and/or training of the model is suspended for the flow path associated with the closed valve during the time that the valve is closed.

13. A method as in any of clauses 10 to 12, wherein all relevant valves and pumps within the flow network are required to have a zero flow rate during training of the model, and/or requiring that training of the model be suspended for associated parts of the flow network, when the relevant valve is closed or the relevant pump is inactive.
14. A method as in any preceding clause, wherein the oil and gas network comprises multiple wells supplying hydrocarbon fluids via one or more manifolds and one or more separators into one or more output flow paths with output flow rates, wherein the total output flow rates are measured flow rates and these measured values can be used as inputs to the long-term and short term models, with future values for flow rates being predictable using the combined model, and where the long-term model is used for estimating the flow rates within different parts of the flow network and to estimate the contribution of different flow paths to the total flow rates.
15. A method as in any preceding clause, wherein the long-term model and/or the short-term model make use of one or more data driven models, machine learning models or artificial neural net models.
16. A method as in any preceding clause, wherein the method makes use of a compact database of data to generate one or both of the long term model and the short term model.
17. A method as in clause 16, wherein the method includes obtaining the compact database of data used to generate the long term model and/or the short term model, and the method of obtaining the compact databases comprises:
    (1) gathering historical data and/or live data relating to the status of multiple control points at different branches within the flow network and to one or more flow parameter(s) in one or more flow path(s) of the flow network;
    (2) identifying time intervals in the data during which all of the control points and all of the flow parameters are in a steady state; and
    (3) extracting statistical data representative of some or all steady state intervals identified in step (2) to thereby represent the original data from step (1) in a compact form.
18. A method as in clause 16 or 17, wherein the compact database of data is a compact database in which as well as identifying steady state time intervals there is also identification and categorisation of types of transient data.
19. A method as in clause 18, wherein the compact database of data used to generate the long-term model and/or the short term model is data recorded from an oil and gas flow network, by a method comprising:
    (1) gathering data covering a period of time, wherein the data relates to the status of one or more control points within the flow network and to one or more flow parameter(s) of interest in one or more flow path(s) of the flow network;
    (2) identifying multiple time intervals in the data during which the control point(s) and the flow parameter(s) can be designated as being in a category selected from multiple categories relating to different types of stable production and multiple categories relating to different types of transient events, wherein the data hence includes multiple datasets each framed by one of the multiple time intervals;
    (3) assigning a selected category of the multiple categories to each one of the multiple datasets that are framed by the multiple time intervals; and
    (4) extracting statistical data representative of some or all of the datasets identified in step (2) to thereby represent the original data from step (1) in a compact form including details of the category assigned to each time interval in step (3).
20. A method as in any of clauses 16 to 19, wherein the long-term model is generated using data from the compact database covering the first time period, and the short-term model is generated using data from the same compact data base covering the second time period.
21. A method as in any preceding clause, wherein the modelling of the oil and gas network includes determining the effect of potential adjustments to the control points in order to optimise the performance of the oil and gas flow network, for example by increasing or decreasing flow rates.
22. A method as in any preceding clause, wherein the method includes: interacting with the real-world oil and gas flow network by implementing proposed adjustment(s), gathering new data after the adjustment and using the new data in further modelling of the flow network using the method of any preceding clause.
23. A method as in any preceding clause, wherein the control points include control devices capable of applying a controlled adjustment to the flow network, in particular an adjustment to the flow of fluid within the network to prompt changes in one or more flow parameter(s).
24. A method as in any preceding clause, wherein the flow parameter(s) that are measured include one or more parameters that may vary for an entire volume of a combined flow in response to variations in individual branches of the flow network, such as one or more of pressure, flow rate, fluid level or temperature.
25. A method as in any preceding clause, wherein the flow parameter(s) include one or more parameter(s) relating to the characteristics of the fluid in the flow network, such as density, pH, water cut (WC), productivity index (PI), Gas Oil Ratio (GOR), BHP and wellhead pressures, rates after topside separation, other rate measurements such as water after subsea separation, other pressures, such as manifold line pressure, separator pressure, other line pressures, flow velocities or sand production.
26. A model of an oil and gas flow network produced using the method of any preceding clause.
27. A computer system for modelling of an oil and gas flow network, wherein the computer system is configured to perform the method of any of clauses 1 to 25.
28. A computer system as in clause 27, wherein the computer system is arranged to gather the first set of data and/or the second set of data, and/or to process data for the first set of data and/or the second set of data to form a compact database.
29. A computer program product comprising instructions for execution on a computer system arranged to receive data relating control points and flow parameters in a flow network; wherein the instructions, when executed, will configure the computer system to carry out a method as in any of clauses 1 to 25.
30. A method for training a model of an oil and gas network, the network comprising multiple branched flow paths, such as in multi-zonal wells and/or multi-branched wells, and/or networks including multiple wells, and multiple control points at different branches, wherein the multiple control points include multiple valves and/or pumps for controlling the flow rate through respective flow paths of the multiple branched flow network; and the method comprising:

modelling one or more flow parameter(s) in one or more flow path(s) of the network, the modelling including:

generating a model using data relating to measurements of the flow parameter(s) and the status of the control points over a period of time;

wherein the model describes the relationship between flow rates, the status of control points, and measured flow parameters including pressure and/or temperature; and wherein generating the model includes training the model under constraints requiring:

(i) that the sum of the modelled flow rates from each branch of the flow network that contribute to a combined flow after branched flow paths join at one or more nodes must be equivalent to the respective measured combined flow rate, where a measurement of the combined flow is available, and (ii) that training of the model is suspended for certain flow paths when the status of the control points is such that those flow paths will have zero flow, and/or that a flow rate for an individual flow path or branch must be zero when an associated valve is closed and/or if a pump required for non-zero flow rate is inactive.

31. A method as in clause 30, wherein the model comprises one or more data driven models, machine learning models and/or artificial neural net models; and wherein the model may be split into sub-models such that training of sub-models may be suspended during step (ii).

32. A method as in clause 30 or 31, wherein the network includes one or more pumps that are required to be active for the flow rate at that point within the flow network to be above zero, and during training of the model, the flow rate for the flow path associated with the pump is required to be zero if the pump is inactive and/or training of the model is suspended for that flow path if the pump is inactive.

33. A method as in clause 30, 31 or 32, wherein the network includes one or more valve(s), such as choke valves, wing valves, master valves, down hole safety valves, where the valves control flow rate through flow paths at branches of the network and where the flow rate will be zero when the valve is closed, and during training of the model the flow rate at the flow path associated with the valve is required to be zero when the valve is deemed to be closed, and/or training of the model is suspended for that flow path when the valve is deemed to be closed, wherein the valve is deemed to be closed when the valve opening is below a threshold value.

34. A method as in any of clauses 30 to 33, wherein all relevant valves and pumps within the flow network are required to have a zero flow rate during training of the model, and/or the method including requiring that training of the model be suspended for associated parts of the flow network, when the valve is closed or the pump is inactive.

35. A method as in any of clauses 30 to 34, wherein the flow rate for the flow path associated with the valve(s) and/or pump(s) is set as zero when for a close valve or an inactive pump using an activation signal defined as zero when the valve opening is below a threshold (including a closed valve) or the pump is inactive and is defined as 1 in other circumstances.

36. A method as in any of clauses 30 to 35, wherein the method makes use of a compact database of data to train the model.

37. A method as in clause 36, wherein the method includes obtaining the compact database of data used to train the model, and the method of obtaining the compact databases comprises:

(1) gathering historical data and/or live data relating to the status of multiple control points at different branches within the flow network and to one or more flow parameter(s) in one or more flow path(s) of the flow network;

(2) identifying time intervals in the data during which all of the control points and all of the flow parameters are in a steady state; and (3) extracting statistical data representative of some or all steady state intervals identified in step (2) to thereby represent the original data from step (1) in a compact form.

38. A method as in clause 36 or 37, wherein the compact database of data is a compact database in which as well as identifying steady state time intervals there is also identification and categorisation of types of transient data.

39. A method as in clause 38, wherein the compact database of data used to train the model is data recorded from an oil and gas flow network, by a method comprising:

(1) gathering data covering a period of time, wherein the data relates to the status of one or more control points within the flow network and to one or more flow parameter(s) of interest in one or more flow path(s) of the flow network;

(2) identifying multiple time intervals in the data during which the control point(s) and the flow parameter(s) can be designated as being in a category selected from multiple categories relating to different types of stable production and multiple categories relating to different types of transient events, wherein the data hence includes multiple datasets each framed by one of the multiple time intervals;

(3) assigning a selected category of the multiple categories to each one of the multiple datasets that are framed by the multiple time intervals; and (4) extracting statistical data representative of some or all of the datasets identified in step (2) to thereby represent the original data from step (1) in a compact form including details of the category assigned to each time interval in step (3).

40. A method of modelling an oil and gas network, the network comprising multiple branched flow paths, such as in multi-zonal wells and/or networks including multiple wells, and multiple control points at different branches, wherein modelling the network includes modelling of the variation of one or more flow parameter(s) in one or more flow path(s) of the network; the method comprising:

using the model of any clauses 30 to 39 as a long-term model, wherein this long-term model is trained using a first set of data relating to measurements of the flow parameter(s) and the status of the control points over a first period of time, wherein the long-term model hence describes the relationship between flow rates, the status of control points, and measured flow parameters including pressure and/or temperature;

generating a short-term model using a second set of data relating to measurements of the flow parameter(s) and the status of the control points over a second period of time, wherein the second period of time is shorter than the first period of time, and wherein the short-term model describes the relationship between the status of control points and flow parameters including pressure and/or temperature; and combining the short-term model with the long-term model by: using the short-term model to determine pressure and/or temperature values that will result from the status of one or more control points or from proposed changes to those control points; using the determined pressure and/or temperature values from the short-term model along with the status of, or the proposed changes to, the control points as inputs to the long-term model and then using the long-term model to determine flow rate values that will result from those inputs; and thereby obtaining a combined model allowing for estimation of flow rates in real time as well as prediction of the effects of changes in the status of one or more of the control points.

41. A method as in clause 40, wherein the first time period has a length such that a reservoir effect arising from depletion of the reservoir over time has an impact on the flow parameter(s) during the first time period; the second time period has a lesser length such that the reservoir effect is reduced in order that the long-term model is affected to a greater degree by the reservoir effect, and the short-term model is affected to a lesser degree; and the output from the short-term model acts as an input within the long-term model so that the short term impact of control point adjustments can be overlaid with the longer-term data that includes the reservoir effect in order that accurate predictions and/or estimations can be made using the combined model.

42. A method as in clause 40 or 41, wherein the first time period fully overlaps the second time period and thus includes all of the data from the second time period as well as added data going further back in time, with the first, longer, time period extending backward in time from a reference time and the second, shorter, time period extends backward in time from the same reference time.

43. A method as in clause 40, 41 or 42, wherein the length of the first time period is at least twice the length of the second time period, or at least three times the length of the second time period.

44. A method as in clause 43, wherein the length of the first time period is at least five times the length of the second time period, optionally at least ten times the length of the second time period.

45. A method as in any of clauses 40 to 44, wherein the first time period covers a time during which 100 or more changes are made to control points, optionally 1000 or more; and the second time period covers a time during which the number of changes to control points is less than a half of the number for the first time period, optionally less than a fifth of the number of changes.

46. A method as in any of clauses 40 to 45, wherein the second time prior is three months or less and the first time prior is two years or more.

47. A method as in any of clauses 40 to 46, wherein the oil and gas network comprises multiple wells supplying hydrocarbon fluids via one or more manifolds and one or more separators into one or more output flow paths with output flow rates, wherein the total output flow rates are measured flow rates and these measured values can be used as inputs to the long-term and short term models, with future values for flow rates being predictable using the combined model, and where the long-term model is used for estimating the flow rates within different parts of the flow network and to estimate the contribution of different flow paths to the total flow rates.

48. A method as in any of clauses 30 to 47, wherein the model is arranged to determine the effect of potential adjustments to the control points in order to optimise the performance of the oil and gas flow network, for example by increasing or decreasing flow rates.

49. A method as in any of clauses 30 to 48, wherein the method includes: interacting with the real-world oil and gas flow network by implementing proposed adjustment(s), gathering new data after the adjustment and using the new data in further modelling of the flow network using the method of any clauses 30 to 48.

50. A method as in any of clauses 30 to 49, wherein the control points include control devices capable of applying a controlled adjustment to the flow network, in particular an adjustment to the flow of fluid within the network to prompt changes in one or more flow parameter(s).

51. A method as in any of clauses 30 to 50, wherein the flow parameter(s) that are measured include one or more parameters that may vary for an entire volume of a combined flow in response to variations in individual branches of the flow network, such as one or more of pressure, flow rate, fluid level or temperature.

52. A method as in any of clauses 30 to 51, wherein the flow parameter(s) include one or more pararmeter(s) relating to the characteristics of the fluid in the flow network, such as density pH, water cut (WC), productivity index (PI), Gas Oil Ratio (GOR), BHP and wellhead pressures rates after topside separation, other rate measurements such as water after subsea separation and/or rates measured by multiphase meters, other pressures, such as manifold line pressure, separator pressure, other line pressures, flow velocities or sand production.

53. A model of an oil and gas flow network produced using the method of any of clauses 30 to 52.

54. A computer system for modelling of an oil and gas flow network, wherein the computer system is configured to perform the method of any of clauses 30 to 52.

55. A computer system as in clause 54, wherein the computer system is arranged to gather the first set of data and/or the second set of data, and/or to process data for the first set of data and/or the second set of data to form a compact database.

55. A computer program product comprising instructions for execution on a computer system arranged to receive data relating control points and flow parameters in a flow network; wherein the instructions, when executed, will configure the computer system to carry out a method as in any of clauses 30 to 52.

The invention claimed is:
1. A method for training a model of an oil and gas network, the network comprising multiple branched flow paths, such as in multi-zonal wells and/or multi-branched wells, and/or networks including multiple wells, and multiple control points at different branches, wherein the multiple control points include multiple valves and/or pumps for controlling the flow rate through respective flow paths of the multiple branched flow network; and the method comprising:

modelling one or more flow parameter(s) in one or more flow path(s) of the network, the modelling including:

generating a model using measurement data relating to measurements of the flow parameter(s) and the status of the control points over a period of time;

wherein the model describes the relationship between flow rates, the status of control points, and measured flow parameters including pressure and/or temperature; and wherein generating the model includes using the measured data to train the model under constraints requiring:

(i) that the sum of the modelled flow rates from each branch of the flow network that contribute to a combined flow after branched flow paths join at one or more nodes must be equivalent to the respective measured combined flow rate, where a measurement of the combined flow is available, and (ii) that, for at least one flow path of the network, when the measurement data indicates that a valve associated with the flow path is closed or that a pump associated with the flow path is inactive, then training of the model is suspended for that flow path or a modelled flow rate for the flow path is set at or encouraged toward zero.

2. The method of claim 1, wherein the model comprises one or more data driven models, machine learning models and/or artificial neural net models.

3. The method of claim 1, wherein the network includes one or more pumps that are required to be active for the flow rate in an associated flow path within the flow network to be above zero, and during training of the model the modelled flow rate for the associated flow path is required or encouraged to be zero if the one or more pumps are inactive.

4. The method of claim 1, wherein the method includes: interacting with the real-world oil and gas flow network by implementing a proposed adjustment, gathering new data after the adjustment and using the new data in further modelling of the flow network.

5. A computer system comprising a memory and a processor storing instructions which, when executed by the processor, cause the processor to perform the method of claim 1.

6. A non-transitory computer-readable storage medium comprising instructions for execution on a computer system arranged to receive data relating control points and flow parameters in a flow network; wherein the instructions, when executed, will configure the computer system to carry out the method of claim 1.

7. The method of claim 1, wherein the network includes one or more pumps that are required to be active for the flow rate in an associated flow path within the flow network to be above zero, and wherein, during training of the model, the training of the model is suspended for the associated flow path if the one or more pumps are inactive.

8. The method of claim 1, wherein the network includes a valve, such as a choke valve, where the valve controls flow rate through an associated flow path at a branch of the network, and wherein, during training of the model, the modelled flow rate at the associated flow path is required or encouraged to be zero when the valve is deemed to be closed, which may include when the valve opening is below a threshold value.

9. The method of claim 1, wherein the network includes a valve, such as a choke valve, where the valve controls flow rate through an associated flow path at a branch of the network, and wherein, during training of the model, the training of the model is suspended for the associated flow path during a time that the valve is deemed to be closed, which may include when the valve opening is below a threshold value.

10. The method of claim 1, wherein the model is split into sub-models such that training of one or more of the sub-models can be suspended when training the model using the measured data.

\* \* \* \* \*